United States Patent
Reschka et al.

(10) Patent No.: US 11,814,059 B1
(45) Date of Patent: Nov. 14, 2023

(54) SIMULATING AUTONOMOUS DRIVING USING MAP DATA AND DRIVING DATA

(71) Applicant: Zoox, Inc., Foster City, CA (US)

(72) Inventors: Andreas Christian Reschka, Foster City, CA (US); Guillermo Duenas Arana, Chicago, IL (US); Collin MacGregor, Foster City, CA (US); Gonzalo Javier Rey, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 407 days.

(21) Appl. No.: 16/376,842

(22) Filed: Apr. 5, 2019

(51) Int. Cl.
  *G06F 30/20* (2020.01)
  *B60W 50/04* (2006.01)
  *G05D 1/02* (2020.01)
  *B60W 40/09* (2012.01)
  *B60W 50/00* (2006.01)

(52) U.S. Cl.
  CPC .......... *B60W 50/045* (2013.01); *B60W 40/09* (2013.01); *G05D 1/0274* (2013.01); *G06F 30/20* (2020.01); *B60W 2050/0031* (2013.01)

(58) Field of Classification Search
  CPC ............... B60W 50/045; B60W 40/09; B60W 2050/0031; G06F 30/20; G05D 1/0274
  See application file for complete search history.

(56) References Cited

U.S. PATENT DOCUMENTS

| | | | |
|---|---|---|---|
| 9,507,346 B1 * | 11/2016 | Levinson | G05D 1/0291 |
| 10,915,100 B2 * | 2/2021 | Matsushita | G05D 1/0061 |
| 2017/0132334 A1 * | 5/2017 | Levinson | G06F 30/20 |
| 2018/0107770 A1 * | 4/2018 | Cahoon | G06F 30/20 |
| 2019/0129831 A1 * | 5/2019 | Goldberg | G06F 3/04847 |
| 2020/0070822 A1 * | 3/2020 | Yamada | B60W 60/00276 |
| 2020/0225676 A1 * | 7/2020 | Telpaz | B60W 40/09 |
| 2021/0078602 A1 * | 3/2021 | Wray | H04L 63/1425 |

FOREIGN PATENT DOCUMENTS

| | | | | |
|---|---|---|---|---|
| EP | 1997705 A1 * | 12/2008 | | B60W 30/16 |
| WO | WO-2017100797 A1 * | 6/2017 | | B60T 8/172 |

OTHER PUBLICATIONS

Zhang, Intelligent Computational Transportation, 2018, The University of New Mexico, Proquest Dissertations Publishing (Year: 2018).*

* cited by examiner

Primary Examiner — Elaine Gort
Assistant Examiner — Chanmin Park
(74) Attorney, Agent, or Firm — Lee & Hayes, P.C.

(57) ABSTRACT

Testing autonomous vehicle control systems in the real world can be difficult, because creating and re-creating physical scenarios for repeated testing may be impractical. In some implementations, detailed map data and data acquired through driving in a region can be used to identify similar segments of a drivable surface. Simulation scenarios used to test one of the similar segments may be used to test other of the similar segments. The driving data may also be used to generate and/or validate the simulation scenarios, e.g., by re-creating scenarios encountered while driving in a first segment in a simulation scenario for use in the second segment and comparing simulated driving behavior with the driving data.

20 Claims, 5 Drawing Sheets

US 11,814,059 B1

SIMULATING AUTONOMOUS DRIVING USING MAP DATA AND DRIVING DATA

BACKGROUND

Vehicles are increasingly supplementing or replacing manual functionality with automatic controls. Fully-autonomous vehicles are reducing all passengers to passive participants as they are shuttled to their destination. Autonomous driving, however, requires robust computing systems capable of making split-second decisions to respond to myriad events and scenarios. Robustness of a computing system may be confirmed via physical tests, e.g., by driving the vehicle in one or more environments for extended periods of time and/or for numerous miles. However, physical testing has limits. For instance, performing physical tests among traffic and pedestrians may be unsafe. Moreover, it may be virtually impossible to exactly repeat physical tests. Physical testing also limits the number of practicable number of scenarios that can be tested. Simulations can be used to test operating software for autonomous vehicles in some instances. Simulations attempt to re-create the world and obstacles within the world to accurately reproduce scenarios that can be encountered by an autonomous vehicle.

DETAILED DESCRIPTION

Figure 1:
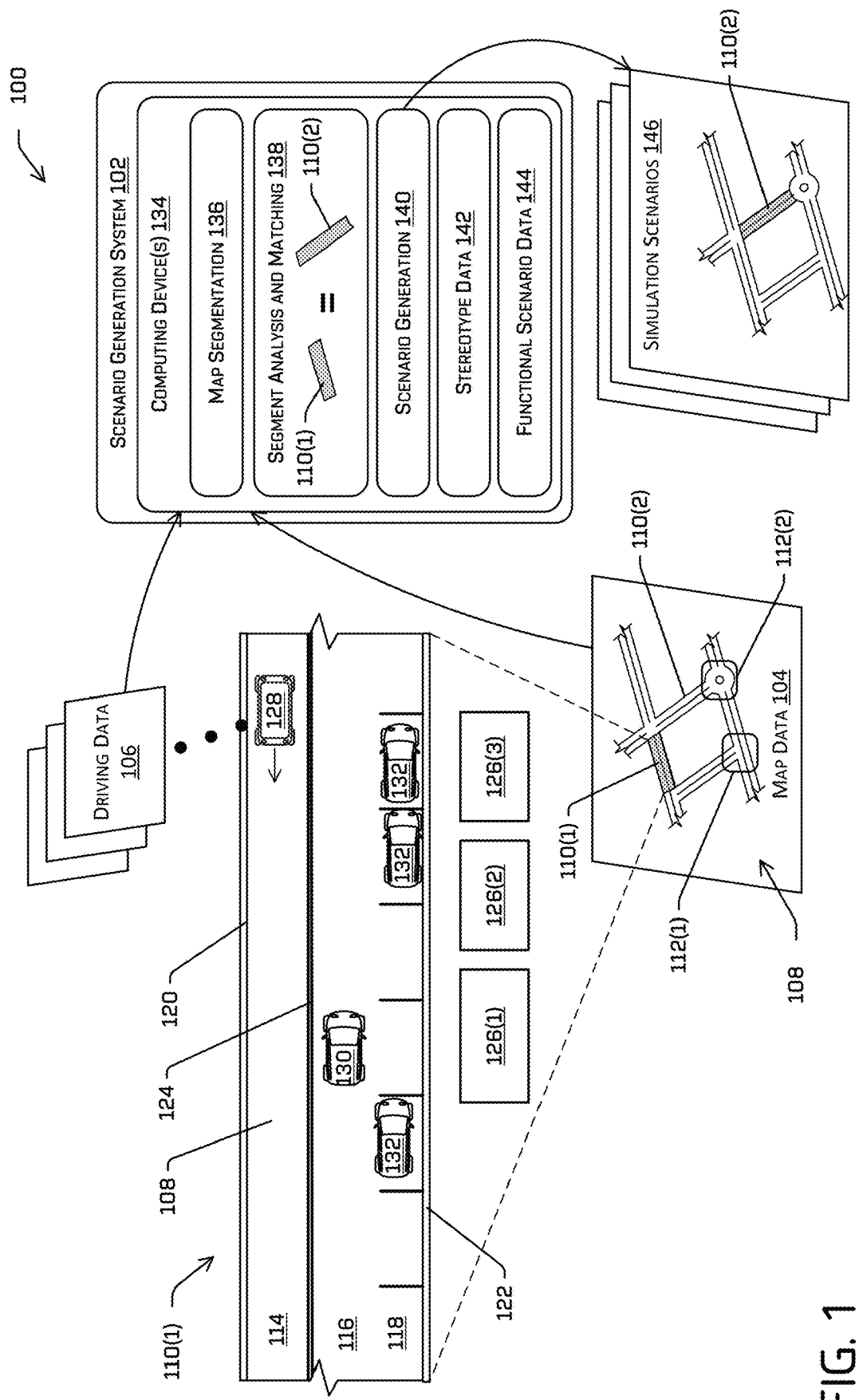
FIG. 1 illustrates an example of generating simulations scenarios for testing autonomous vehicle control systems according to aspects of this disclosure.

The following detailed description is directed to techniques for creating simulations using map data and driving data. Though the technologies described can be generally applicable to various simulation environments, for the purpose of brevity, the detailed discussion is directed to examples involving vehicles. In some examples, simulations can be used to learn about the constraints of autonomous vehicles running based on the software. For instance, simulations can be used to understand the operational space of an autonomous vehicle (i.e. the envelope of parameters in which the autonomous controller effectively controls the autonomous vehicle) in view of surface conditions, ambient noise, faulty components, etc. Simulations can also be useful for generating feedback for improving operations and designs of autonomous vehicles. For instance, in some examples, simulations can be useful for determining an amount of redundancy that is required in an autonomous controller, or how to modify a behavior of the autonomous controller based on what is learned through simulations. Furthermore, in additional and/or alternative examples, simulations can be useful to inform the hardware design of autonomous vehicles, such as optimizing placement of sensors on an autonomous vehicle.

Simulation scenarios may attempt to specifically enumerate the environment, including objects (static and/or dynamic) in the environment, with various and specific examples. Each instantiation of the environment can be unique and defined. Enumerating all possible scenarios manually can require inordinate amounts of time and, if not every possible scenario is constructed, various scenarios can go untested. Additionally, even though multiple scenarios can be described, there is no guarantee that the additional scenarios provide any additional, useful, information. For example, incremental differences in starting positions of simulated vehicles at an intersection can only provide marginal, if any, additional useful information about the ability of an autonomous vehicle to respond in the scenario given a particular set of computer code.

Techniques described herein are directed to generating simulation scenarios for testing autonomous vehicle controllers. In examples, the region in which the vehicle is to be operated can be parsed into segments and similar segments can be identified. In examples, the same or similar simulation scenarios can be used to verify functionality of the autonomous vehicle controller in the similar segments. In one example, by identifying similar regions, techniques described herein can identify a limited number of simulation scenarios that will provide useful information. The techniques described herein can reduce computational complexity, memory requirements, and processing time by optimizing over specific scenarios which provide useful information for validation and testing.

In some examples, techniques described herein can parse map data into multiple segments of a drivable surface. For example, techniques of this disclosure may generate segments from the map data. In some instances, a segment can include a junction segment, e.g., an intersection; a merge, or the like; or a connecting road segment, e.g., an extent of a road between junctions. Systems described herein can also associate data with each of the individual segments. For instance, a junction segment may include a junction type, e.g., a merge, a "T," a round-about, or the like; a number of roads meeting at the junction; a relative position of those roads, e.g., an angle between the roads meeting at the junction; information about traffic control signals at the junction; and/or other features. Data associated with a connecting road segment can include a number of lanes, a width of those lanes, a direction of travel in each of the lanes, an identification of parking lanes, a speed limit on the road segment, and/or other features.

In some examples, techniques described herein can group segments of the drivable surface, e.g., according to a segment classification or segment stereotype. By way of non-limiting example, all junction segments that conform to some range of metrics or attributes may be grouped together (e.g., using k-means, evaluating a weighted distance (e.g., Euclidian) between segment parameters, or otherwise clustering such segments based on segment parameters). For instance, an autonomous vehicle may be expected to perform (and/or may have demonstrably performed) the same in each of the junctions within a stereotype. Similarly, connecting road segment stereotypes can also be grouped according to one or more similarities. By way of non-limiting example, all two-lane road segments having a speed limit within a 10-mph range may be associated with the same stereotype. In some examples, the use of stereotypes can reduce a number of comparisons to be made.

In examples, techniques described herein can compare segments with other segments or with segment stereotypes to determine similarities. In implementations, map data and/or driving data obtained by a vehicle traversing through a region can identify different attributes for the segments. For instance, attributes can include physical attributes, e.g. a number of lanes in a road segment, a number of road segments converging at an intersection or junction, and angle of that convergence, a direction of travel, or the like. Attributes can also include traffic control attributes, e.g., speed limits, directions of travel in specific lanes, or the like. Any number of these attributes can be compared across multiple segments (or to a stereotype) to determine the similarities.

In some examples, the techniques described herein may generate simulation scenarios for a segment or portion of a region based on a determination that the segment is similar to or substantially the same as another region. For instance, simulation scenarios used to test and/or verify a vehicle control system relative to a first segment may be used to generate similar simulation scenarios to test in similar segments. Moreover, in some examples, the driving data associated with a first segment can be used to generate simulation scenarios for simulating operation in a second segment. For instance, situations encountered while travelling in the first segment can be re-created in a simulation of the second segment. In at least some examples, all identified "stereotypes" of segments identified for a given area (e.g., geofence, region, etc. may be simulated to validate the ability of an autonomous vehicle to navigate. Also, in techniques, a vehicle may be controlled in the given area based on the results of the simulation(s) and/or to verify, the results of the simulation(s). In some instances, functionality of the vehicle can be limited and/or otherwise defined based on the similarity of the compared segments.

The techniques discussed herein can improve functioning of an autonomous vehicle in a number of ways. For example, the techniques discussed herein may facilitate safer travel, e.g., by allowing for meaningful and robust simulation that can readily validate operation of the autonomous vehicle. Moreover, techniques described herein can improve the functioning of a computer, e.g., by reducing the amount of processing necessary to evaluate operability of an autonomous vehicle on drivable surfaces in a region. These and other improvements to the functioning of the autonomous vehicle and/or to computing systems associated with the autonomous vehicle, and/or to the user experience are discussed herein.

The techniques described herein can be implemented in a number of ways. Example implementations are provided below with reference to the FIGS. 1-6, Although discussed in the context of an autonomous vehicle, the methods, apparatuses, and systems described herein can be applied to a variety of systems, and is not limited to autonomous vehicles. In another example, the techniques can be utilized in robotic, aviation, and/or nautical contexts, e.g., to simulate operation of devices.

FIG. 1 illustrates an example environment 100 in which the techniques discussed herein may be implemented. Specifically, FIG. 1 illustrates a scenario generation system 102 for generating simulation scenarios to test aspects of an autonomous vehicle as detailed further herein. In general, the scenario generation system 102 can generate simulation scenarios using map data 104 and driving data 106. For instance, the scenario generation system 102 can generate simulation scenarios for testing similar regions or segments in the map data 104.

In more detail, and as illustrated in FIG. 1, the map data 104 may be map data of one or more drivable surfaces 108 on which an autonomous vehicle has been operating and a surrounding environment. The map data 104 may include detailed maps used by one or more autonomous vehicles to travel through a geographic area along the drivable surface(s) 108, for example, utilizing simultaneous localization and mapping (SLAM) techniques. By way of non-limiting example, the map data 104 may include a 3D mesh of the drivable surface(s) 108 and/or of the geographic area including the drivable surface(s) 108, as well as information about aspects of the drivable surface(s) 108, including but not limited to extents of the drivable surface(s) 108, road marking information, traffic control information, or the like. In the illustrated example, the drivable surface(s) 108 may include a number of road segments including a first road segment 110(1) and a second road segment 110(2), and a number of intersections, including a first intersection 112(1) and a second intersection 112(2). Of course, the representation of the drivable surface(s) 108 is for illustration only; a given geographic area will have drivable surfaces with different features, configurations, and the like.

FIG. 1 also includes a more detailed illustration of the first road segment 110(1). More specifically, the first road segment 110(1) includes a plurality of lanes including a first driving lane 114, a second driving lane 116, and a parking lane 118. In the illustrated example, the first lane 114 may be designated for traffic moving in a first direction, e.g., right to left in the orientation shown, and the second lane 116 may be designated for travel in the opposite direction, e.g., left to right in the illustrated orientation. The parking lane 118 may include a plurality of parking spaces, e.g., designated for parallel parking in the illustration. As also illustrated, a first side of the road segment 110(1), e.g., proximate the first lane 114, may be bounded by a first boundary 120 and the opposite side of the road segment 110 (1), e.g., proximate the parking lane 118, may be bounded by a second boundary 122. A centerline 124 also is illustrated. In the example, the boundaries 120, 122 may be physical boundaries, e.g. curbs, walls, or the like, visual boundaries, e.g., painted lines, or otherwise. The centerline 124 is illustrated as a double solid line, but could be different in other implementations. In the illustration, the boundaries 120, 122 may define an extent of a width of the road segment 110(1) and/or the boundaries 120, 122, together with other features such as the centerline 124 may define the extents of the lanes 114, 116, 118.

The representation of the road segment 110(1) also includes representations of three buildings 126(1), 126(2), 126(3) (collectively, "the buildings 126"). The buildings 126 are provided as examples only, intended to illustrate that the map data 104 can include data about features additional to the drivable surface 108. For example, the map data 104 can include information, e.g., 3-D information, about any or all fixtures or generally static objects in the environment of the drivable surface 108. Other examples of objects that may be included in the map data 104 can include traffic signs, streetlamps, traffic lights, fire hydrants, and/or other objects. Also in examples, the driving data 106 can be used to confirm, modify, and/or supplement the map data 104. For example, the driving data 106 can detect variations from the map data 104. In a non-limiting example, the driving data may identify new buildings, fixtures, or other objects in the environment but not included in the map data 104. In some instances, the driving data 106 can be used to update the map data 104. The driving data 106 may also include vehicle performance data, e.g., generated by a vehicle as it traverses through the environment. Accordingly, the driving data 106 can include controls generated and/or executed by the autonomous vehicle as it traversed the region(s).

Some aspects of the road segment 110(1) can vary. In the illustrated example, an autonomous vehicle 128 may be traveling along the drivable surface 108, e.g., in the first lane 114. Also in the illustration, an additional vehicle 130 is traveling in an opposite direction, e.g., in the second lane 116. Moreover, three parked vehicles 132 are illustrated in the parking lane 118. As will be appreciated, the presence and/or position of the autonomous vehicle 128, the additional vehicle 130, and the parked vehicles 132 may vary, and these representations are provided for example only. In other examples, more or fewer additional vehicles 130 may be present, including in the first lane 114 and/or the second lane 116. Similarly, more or fewer parked cars 132 may be present. Other objects also may be present in an environment of the first road segment 110 (1), including but not limited to pedestrians, bicyclists, skateboarders, street vendors, or the like.

In the illustrated example, the autonomous vehicle 128, as it traverses the first road segment 110(1), can generate data about the road segment 110(1) and/or elements or objects in the environment of the first road segment 110(1). In a brief and nonlimiting example, the autonomous vehicle 128 may be include a plurality of sensors configured to generate sensor data, e.g., as the driving data 106, as the vehicle 128 traverses the road segment 110(1). Sensor systems are described further herein, but the autonomous vehicle 128 can include any number and/or types of sensors, including but not limited to, LiDAR sensors, radar sensors, time of flight sensors, imaging devices, audio capture devices, or the like. In at least some examples, the autonomous vehicle 128 may include sensors capable of obtaining sensor data about a 360° field of view around the autonomous vehicle 128. Accordingly, in examples, the autonomous vehicle 128 may be using the map data 104 to drive along the drivable surface 108 in the first road segment 110 (1), and may be obtaining the driving data 106 as it so travels. In some examples, the driving data 106 may be used to supplement the map data 104, as described above.

In implementations of the present disclosure, the map data 104 and the driving data 106 also may be used by the scenario generation system 102 to generate simulation scenarios. As used herein, a simulation scenario can include data that simulates a driving environment of an autonomous vehicle, aspects of the autonomous vehicle and/or objects in the environment of the autonomous. For example, simulation scenarios can be used to test a control system of an autonomous vehicle, e.g., by simulating a scenario or event. In some examples, a simulation scenario can include vehicle control information, which may be a trajectory, state, or command for the autonomous vehicle controller, and object information, which may simulate objects and attributes and/or behaviors of those Objects. In some instances, the vehicle control information and/or the object information can be embodied in the simulation scenario as sensor data, e.g., perceived by the vehicle control system as an object, but in the simulated environment.

In some examples, and in general, the scenario generation system 102 may identify road segments that are similar to the first road segment 110(1) and generate simulation scenarios to test a vehicle response in those similar segments. In more detail, the scenario generation system 102 can include one or more computing devices 134 configured to receive and/or otherwise access the map data 104 and the driving data 106. In general, and in some instances, the computing device(s) 134 can include various components to perform various processing and/or operations using the map data 104 and/or the driving data 106. For example, the computing devices 134 can include a map segmentation component 136, a segment analysis and matching component 138, and a scenario generation component 140. As also illustrated, the computing devices 134 may also store, receive, and/or access stereotype data 142 and functional scenario data 144.

The map segmentation component 136 can include functionality to identify segments of map data corresponding to discrete portions of a drivable surface in a geographic area, e.g., the road segments 110 and/or the intersections 112 of the drivable surface 108. In some instances, the discrete portions can include road junctions, e.g., the intersections 112, and connecting road segments, e.g., the segments 110. A road junction may be a confluence of two or more connecting road segments and a connecting road segment may be a portion of a road extending between two junctions. In other examples, the discrete portions may be segments of road junctions and/or connecting road segments. For instance, the map segmentation component 136 can identify individual lanes or groupings of two or more lanes in either a road junction or a connecting road segment. Similarly, the map segmentation component 136 can include functionality to identify portions of a junction, e.g., the junction of two road segments at a four-way intersection. As can be understood, a drivable surface can include a number of physical portions, and the segments should not be limited to those expressly discussed herein. In some instances, a map segment can define a location, an extent, and information associated with the map segment.

The map segmentation component 136 can implement a number of techniques for identifying segments in the map data 104. By way of nonlimiting example, when the map data includes image data, the map segmentation component 136 can implement feature recognition techniques, including not limited to edge detection techniques, to determine the extents of a drivable surface and/or lane markings on the drivable surface. In other examples, the map segmentation component 136 can implement segmentation and or classification techniques on the map data, e.g., to identify portions of sensor data associated with different classifications. In some examples, drivable surface can be a classification identified using semantic segmentation. In at least some examples, various clustering-based algorithms may be used to identify certain lane segments (k-means, k-mediods, DBSCAN, etc.) Other techniques also may be used.

The map segmentation component 136 can also associate features or attributes, e.g., non-physical features/attributes, with identified physical segments. For instance, the map segmentation component 136 can associate traffic control information with segments of the drivable surface. By way of non-limiting example, the traffic control information can include information about a speed limit, about a direction of travel, about traffic control devices, e.g., stop signs, yield signs, traffic lights. Additional traffic control information can include information about cross walks, parking zones, no-parking zones, bike lanes, HOV information, or the like. In implementations, the map segmentation component 136 can identify physical drivable surface segments and associate any and all information that can impact safe and legal travel in such segments. In some examples, such traffic control information can be traffic control features and one or more traffic control features can be represented as one or more feature vectors. As described herein, the feature vectors can be compared to determine similarities. Thus, in the example of FIG. 1, the map segmentation component 136 can identify the physical attributes and extents of the drivable surface 108 of the first road segment 110(1), e.g., based on the lanes 114, 116, 118, the boundaries 120, 122, identified lane markers, e.g., the centerline 124, and/or other physical features. Moreover, the map segmentation component 136 can associate non-physical attributes with the first road segment 110(1). In the example, the nonphysical attributes may include a speed limit, the respective directions of travel for the first lane 114 and the second lane 116, as well as any other information about the road segment 110(1).

The segment analysis and matching component 138 can include functionality to compare segments identified by the map segmentation component 136 and determine similarities therebetween. For instance, the segment analysis and matching component 138 can identify segments from the map data 104 that are similar or the same. In the illustrated example, the segment analysis and matching component 138 of the scenario generation system 102 may determine that the first road segment 110(1) is the same as or substantially similar to the second road segment 110(2). In some examples, the segment analysis and matching component 138 can compare individual of the segments from the map data 104 to other individual segments to find analogs. Such analysis may comprise determining a distance (e.g., a Euclidian distance) between a feature vector associated with one segment and the one or more clusters or segments identified in the map segmentation component 136, as discussed herein. For instance, similarity can be determined by comparing attributes and/or values of attributes associated with the segments. According to a simple, non-limiting example, the map segmentation component 136 may identify, from the map data 104, the first road segment 110(1) as a relatively straight, two-lane connecting road segment with a single parking lane and a 30-mph speed limit. The segment analysis and matching component 138 can identify one or more other relatively straight, two-lane connecting road segments with a single parking lane and a 30-mph speed limit in the map data 104. In this simple example, the measured attributes, e.g., the straightness of the road segment, the number of lanes, and the speed limit may be substantially identical. In other examples, however, the similarities may be less exact. For example, other road segments may include a two-lane connecting road segment with a single parking lane, some degree of curvature and a 40-mph speed limit. In examples described herein, the segment analysis and matching component 138 can determine a similarity metric that quantifies a similarity of the first segment 110(1) to this and other road segments.

In some examples, a similarity metric may factor in a number of attributes and determine how many of those attributes are the same and/or similar between compared segments. Some example attributes can include physical attribute or traffic control attributes. Physical attributes may include, for example, extents (e.g., length, width), a number of lanes, a curvature, a grade, a road type (e.g., paved, gravel, dirt, market, unmarked), a curb or no curb, a median or no median, and the like. Traffic control attributes can include, for example, information about the speed limit, a direction of travel, traffic control elements (e.g., traffic lights, stop signs, yield signs), crosswalks, bike lanes, HOV rules, turning rules (e.g., no left turn, no right on red), or the like. In some instances, a similarity metric or similarity score may be binary, e.g., 1 or 0, match or no match, drivable or not drivable. In other examples, a metric may be determined indicative of how close two segments are with respect to similarity and two segments may be similar based on such a metric not meeting or exceeding a similarity threshold. In some examples, when certain attributes are not identical in two compared segments, the similarity metric may indicate that there is no match, regardless of other attributes being the same or similar. By way of nonlimiting example, a two-lane segment of road that has one lane dedicated to travel in one direction and a second lane dedicated to travel in the opposite direction will not be a match for a two-lane segment of road that has both lanes dedicated to travel in the same direction. In contrast, other attributes may be different, but the segments may still be a match. By way of nonlimiting example, two road segments that are virtually identical, except for the speed limit being 5 mph different may be matches. In this example, the similarity metric may take into account a degree of difference between the two attributes. For instance, speed limits that vary by 5 miles per hour may be more similar than speed limits that vary by 20 miles per hour. In at least one example, the similarity metric may assign a value, e.g., a numerical value representative of this degree similarity and the segment analysis and matching component 138 can generate a composite or other score that includes similarly different attributes.

As will be appreciated, because the map data 104 can be generated and/or updated at least in part on the driving data 106, attributes of the map segments identified by the map segmentation component 136 may be quite detailed and/or known with high specificity. Accordingly, while a simplistic example given above merely describes the number of lanes, speed limit, and road curvature, the segment analysis and matching component 138 may have considerably more abundant and/or precise information about many attributes of the road segments and thus matches can be determined with a relatively high degree of certainty. However, and because of this precision, it may often be the case that two road segments do not match exactly. For example, slight variations in gradient, curvature, width, length, and/or other physical features, as well as variations in traffic control influences may exist between any two segments (and may be quantifiable in part because of the detail provided by the driving data). As noted above, these variations can be accounted for in a similarity metric or other score.

In some examples, the segment analysis and matching component 138 can also consider information about segment stereotypes. For example, the stereotype data 142 can include information about groups or classes of segments that are substantially similar. For example, a segment stereotype may define parameter or attribute values, and/or ranges of parameter or attribute values, that define a road segment type. The segment analysis and matching component 138 can identify road segments that are similar to or include such parameters/ranges and thus are described by the stereotype. In some examples, a stereotype may group together all segments for which the autonomous vehicle is expected (or has proven) to behave similarly. For example, such similarity in behavior may be observed over hours and/or miles of driving over road segments, e.g., from the driving data 106. In some instances, the segment analysis and matching component 138 can execute a machine learning model to group similar road segments in stereotypes and/or to update stereotypes, as described further herein. Thus, in examples of this disclosure, the segment analysis and matching component 138 can compare road segments from the map data 104 with stereotypes determined from the map data 104 and/or the driving data 106 obtained from vehicles, such as the autonomous vehicle 128, travelling along the drivable surface 108.

The scenario generation component 140 can include functionality to generate one or more simulation scenarios 146 for testing aspects of an autonomous vehicle, e.g., operating software of the autonomous vehicle 128. For example, the scenario generation component 140 can determine the simulation scenarios 146 based at least in part on the similarity of road segments, as determined by the segment analysis and matching component 138. In at least some examples, such a scenario generation component 140 may consider driving data 106 associated with at least one segment of a set of segments to determine whether a vehicle would respond according to one or more simulations of related segments. As a non-limiting example, based on recorded driving behavior of a vehicle in one road segment, simulated behavior may be validated. Continuing with the example of FIG. 1, the scenario generation component 140 can generate simulation scenarios 146 for the second road segment 110(2) based on that segment's correspondence to the first road segment 110(1). For example, the scenario generation component 140 can generate simulation scenarios that simulate aspects of the driving data 106, e.g., to test a response of an autonomous vehicle in the second road segment 110(2). As non-limiting examples, the simulation scenarios 146 can include aspects and/or behaviors of the additional vehicle 130 and/or the parked vehicles 132 in a simulated environment simulating the second segment 110(2). Because the first segment 110(1) and the second segment 110(2) are determined to be similar to each other, it may be expected that the autonomous vehicle control system would respond similarly to the same scenarios in those segments.

In some implementations, the scenario generation component 140 may access the functional scenario data 144 to generate the simulation scenarios 146. For example, the functional scenario data may include a database, catalog, or other collection of basic scenarios an autonomous vehicle will perform while operating autonomously. While functional scenarios can vary greatly, depending upon many factors, including desired attributes of the functioning of the autonomous vehicle, a functional scenario can generally include a behavior for an autonomous vehicle and a behavior of one or more objects in an environment of the vehicle. Thus, a simulation of a functional scenario could include information about an environment of the vehicle, a position, state, and or behavior for the vehicle, and/or an identification of and/or information about one or more objects in the environment of the vehicle. Using the representation of the road segment 110 (1) in FIG. 1, a functional scenario could include an instruction to the autonomous vehicle 128 to traverse the segment 110 (1) by following the first lane 114. Simulation scenarios 146 associated with that functional scenario could include physical information about the road segment 110(1), as well as information about the additional vehicle 130 and the parked vehicles 132. For instance, the information about the additional vehicle 130 may include information about a behavior of the additional vehicle 130. In non-limiting examples, the additional vehicle 130 may swerve or otherwise drift within the second lane 116. Also in examples, the single functional scenario, e.g., the instruction to the vehicle to follow a lane, can be the basis for an infinite number of associated simulation scenarios. For example, each of the simulation scenarios can include a different pose, state or trajectory for the autonomous vehicle, can have more, fewer, or different vehicles or objects in the environment of the vehicle, and/or can specify different behaviors for those vehicle s/objects.

The functional scenario data 144 is not limited to the single scenario of an autonomous vehicle following a lane. For example, the functional scenario data may include variations on that scenario, e.g., as additional functional scenarios, and/or entirely different scenarios. As noted above, the functional scenarios can serve as generic scenarios a vehicle may expect to encounter as it traverses through an environment, and can serve as the basis for generating simulation scenarios to test the vehicle's response in various regions. In some examples, the functional scenarios can be generic representations of scenarios actually experienced by an autonomous vehicle, as determined from the driving data 106. Some examples of functional scenarios that can be variations to the "follow a lane" scenario described above can include an object entering the first lane 114, For example, a pedestrian, skateboarder, bicyclist, or the like, can enter the first lane 114, e.g., by crossing the boundary 120. Simulating this scenario, including variations of the scenario, may be helpful in proving safe travel of the vehicle in the environment. Other functional scenarios can also include variations to the "follow a lane" scenario. For instance, instead of an object entering the first lane 114, there may be a static object in the first lane 114. In a real-world example, a traffic cone, garbage can, dead animal, or some other obstruction may be in the first lane 114, and simulation scenarios 146 can be used to determine the vehicle's response to the obstruction, e.g., without actually placing an obstruction in the road. Other obstructions or impediments to travel also can be embodied as functional scenarios. For example, other variations can include an object, e.g., another car, entering or exiting the lane being followed. For instance, when a road segment includes two lanes travelling in the same direction, another vehicle may cut in front of the autonomous vehicle or a vehicle in front of the autonomous vehicle can exit the lane. Regarding the latter, the exiting vehicle may expose another vehicle or object in the first lane. Still further functional scenarios can include approaching a stopped vehicle in a lane in which the autonomous vehicle is travelling or a scenario in which an object, such as a motorcycle, is approaching from behind and travelling in two lanes (e.g., weaving between traffic in two lanes)

Still further functional scenarios can include additional variations on the "follow a lane" scenario discussed above. For example, some scenarios can include a crosswalk extending across the lane to be followed by the vehicle. In a first scenario there may be no traffic control device associated with the crosswalk, whereas in other scenarios a traffic light or other device may be present. In still further variations on the functional scenario, a "keep clear" area can precede the crosswalk. Other impediments may also be present in the road, and can be modelled as functional scenarios. For instance, functional scenarios can include a railroad track with a signal or a railroad track without a signal. A lane closure, e.g., due to construction, can also be modelled as a functional scenario. Other functional scenarios can include a parallel-parked vehicle entering the autonomous vehicle's lane of travel, a perpendicularly-parked vehicle entering the autonomous vehicle's lane of travel, or a diagonally-parked vehicle entering the autonomous vehicle's lane of travel. Still further functional scenarios for road segments in which a vehicle is following a lane can include scenarios in which the lane ends (e.g., a merge), a new lane begins (e.g., next to the autonomous vehicle's lane of travel), the lane splits into two lanes, or the lane merges with another lane, e.g., via a zipper merge. Specific functional scenarios can also embody cars that are "double-parked," e.g., stopped in a lane of travel next to a parking lane. In some examples, a first functional scenario can be based on an adjacent lane being configured for travel in the same direction, a second functional scenario can be based on the adjacent lane being configured for travel in the opposite (e.g., oncoming) direction, and a third functional scenario can be based on the road segment being a single travel lane.

Additional functional scenarios can be based on different objectives or behaviors for the autonomous vehicle, e.g., different from "follow a lane." In some examples, an objective may be to pass a stopped object. For example, the stopped object can be a double-parked vehicle or similar entity. In one scenario there may be oncoming traffic in the adjacent lane whereas in another functional scenario the adjacent lane may be configured for travel in the same direction. Another objective that may be embodied as a functional scenario can be a planned lane change, e.g., when multiple lanes are configured for travel in the same direction.

The foregoing functional scenarios may be generally directed or applicable to travelling along a road segment or connecting road segments, such as the segments 110(1), 110(2). Functional scenarios can also embody behaviors at intersections or junctions of road segments, such as the junctions 112(1), 112(2). For example, common driving scenarios can include an intersection with an all-way stop, an intersection without a traffic control device in one direction in which the autonomous vehicle has the right of way and a similar scenario in which the autonomous vehicle does not have the right of way, an intersection with a traffic light controlling traffic in all directions, making a right on red (e.g., an unprotected turn) at the intersection with the traffic light controlling traffic in all directions, or making a left on green (e.g., a turn across traffic) at the same intersection. Other intersection-related behaviors can also be embodied as functional scenarios. For instance, a functional scenario can include forcing through a blocked intersection (in any direction) with an all-way stop, forcing through an intersection in which not all segments have a stop (e.g., a first scenario in which the autonomous vehicle has a stop and/or a second scenario in which the autonomous vehicle has the right of way). In additional examples, functional scenarios can include navigating a roundabout or traffic circle, entering a parallel parking spot, exiting a parallel parking spot, entering a perpendicular parking spot, exiting the perpendicular parking spot, and/or entering a diagonal parking spot, exiting the diagonal parking spot. Moreover, inasmuch as some autonomous vehicles may be used in ride-hailing services, functional scenarios can also be associated with performing a curbside pick-up, performing a curbside drop off, performing a double-parked pick-up (e.g., picking up in a traffic lane next to parked vehicles), or performing a double-parked drop-off.

The foregoing are only examples of functional scenarios; the functional scenario data 144 may include more or fewer than those discussed. Generally, and as will be appreciated, a functional scenario may act as a generic depiction or embodiment of a behavior expected of and/or a situation encountered by, an autonomous vehicle while driving in an environment. In examples, the scenario generation component can generate the simulation scenarios based at least in part on one or more of the functional scenarios, e.g., as described herein in connection with FIG. 3. In some examples, according to techniques described herein, the simulation scenarios 146 used to test a particular segment of the drivable surface 108 can be based on the similarity of the segment, as discussed above, as well as the driving data 106 for the segment(s).

The segment analysis and matching component 138 can use the stereotype data 142 to identify similarities between segments of the drivable surface 108. In some instances, the scenario generation component 140 can also use the stereotype data 142 to generate the simulation scenarios 146. For instance, the stereotype data 142 may store or otherwise identify a plurality of the simulation scenarios 146 that are applicable to the stereotype. For example, myriad simulations may have been run in a simulated environment corresponding to the first road segment 110(1) and a control system associated with an autonomous vehicle may have performed successfully (e.g., as measured by some performance metric or expectation) in each of those simulations. In one example, and because the second road segment 110(2) has been determined to be associated with the same stereotype as the first road segment 110(1), the scenario generation component 140 can generate or otherwise provide those same simulation scenarios, but in a simulation environment corresponding to the second road segment 110(2). Thus, and as noted above, each of the first road segment 110(1) and the second road segment 110(2) are identified as similar, but will have some variations, e.g., in extents, physical objects present, or the like.

Accordingly, in implementations of this disclosure, the scenario generation component 140 can generate simulation scenarios 146 the can be used to verify or otherwise test a control system associated with an autonomous vehicle on a segment determined to be similar to another segment in the environment. In examples, the driving data 106 may be used to determine similarity of segments for simulation purposes. Moreover, the driving data 106 may be used to inform, e.g., limit, a number of simulation scenarios 146 required to validate or test. For example, the driving data 106 can be used to verify the applicability of certain functional scenarios to an area. In other examples, the driving data 106 may be used to identify additional functional scenarios that should be tested in an area. For instance, if, from the driving data 106, it is determined that pedestrians readily cross the road segment 110(1), e.g., even in the absence of a crosswalk, the simulation scenarios 146 may take this into account, for example, by including scenarios associated with crosswalks. In still further examples, the driving data 106 may be used to model other behaviors in the road segment 110(1), which may then be associated, e.g., in the stereotype data 142, with the stereotype that includes the first road segment 110(1).

Figure 2:
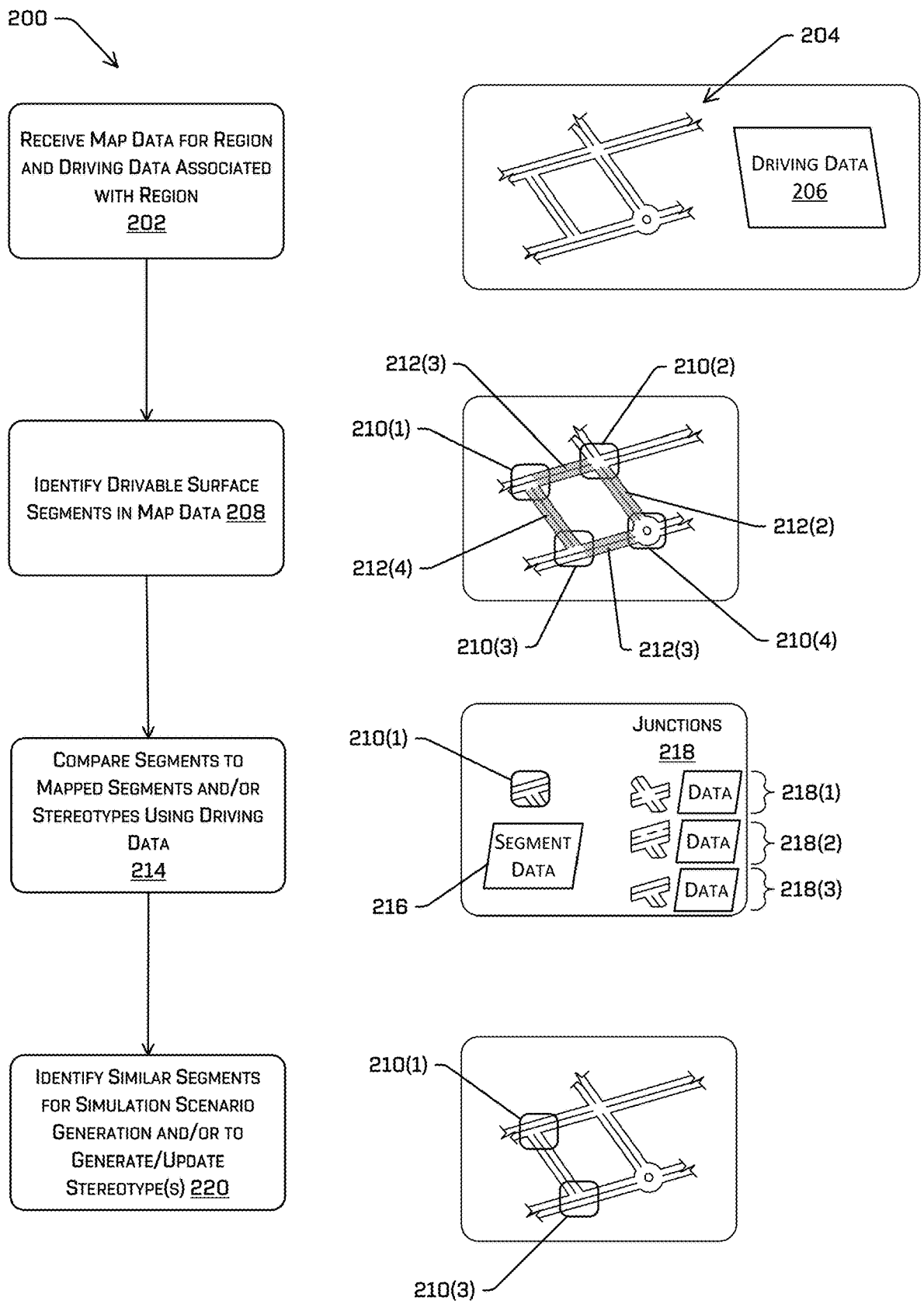
FIG. 2 includes textual and visual flowcharts to illustrate an example method for identifying similar drivable segments in an environment, according to aspects of this disclosure.

FIG. 2 depicts a pictorial flow diagram of an example process 200 for identifying similar segments of drivable surfaces in an environment or geographic region. For example, the process 200 may be implemented by one or more components of the scenario generation system 102, although the process 200 is not limited to use with the scenario generation system 102, and the scenario generation system 102 may perform operations and/or processes in addition to the process 200.

At operation 202, the process 200 may include receiving map data for a region and driving data associated with the region. An example accompanying the operation 202 includes a graphical representation of a map 204 of (a portion of) the region and driving data 206 associated with the region. For example, the map 204 may be representative of the map data 104 and the driving data 206 may correspond to the driving data 106, both discussed above in connection with FIG. 1. For instance, the driving data may include sensor data generated by one or more sensors mounted on, affixed to, or otherwise associated with a vehicle traversing through the environment represented by the map 204.

At operation 208, the process 200 can include identifying drivable surface segments in the map data. In an example accompanying the operation 208, a number of regions of the map 204 are specified. For example, in the illustration, four junctions 210(1), 210(2), 210(3), 210(4) (collectively, the junctions 210) and four connecting road segments 212(1), 212(2), 212(3), 212(4) (collectively, the connecting roads 212) are enumerated (portions of additional road segments also are illustrated, but not labeled). In this example, each of the junctions 210 is a confluence of two or more of the connecting roads 212 and each of the connecting roads 212 extends between two of the junctions 210. In more detail, a first junction 210(1) and a third junction 210(3) may be "T" type junctions at which three of the connecting road segments converge. In the particular example of the first junction 210(1), the three connecting road segments include the first connecting road 212(1), the fourth connecting road 2212(4), and an unlabeled connecting road segment that is a continuation of the first connecting road 212(1). The second junction 210(2) and the fourth junction 210(4) may be different types of intersections. For example, the second junction 210(2) is illustrated as a four-way intersection, and the fourth junction 210(4) is illustrated as a traffic circle or roundabout. Of course, these are only examples of junctions.

As will be appreciated, the map 204 may provide only a small section of a (much) larger area. Thus, in some implementations, there may be hundreds and potentially thousands or more junctions 210 and a similar number of connecting roads 212. Moreover, each junction may have its own characteristics and/or each connecting road 212 may have its own characteristics. By way of nonlimiting example, although the first junction 210(1) and the third junction 210(3) may appear to be the same, in reality, they may be quite different. For instance, traffic control at each of the junctions 210(1), 210(3) can vary. In an example, the junction 210(1) may be a three-way stop, whereas the connecting road segment 212(3) may be a major road, such that a vehicle traveling straight through the junction 210(3) from the connecting road segment 212(3) may not have a stop, whereas traffic on the fourth connecting road 212(4) must stop before entering the intersection embodied by the junction 210(4). Of course, these are but examples. In other examples, one or more of the junctions may include other features, such as crosswalks, turning lanes, yield signs, traffic lights, or the like. Moreover, the fourth connecting road segment 212(4) may be one way in either direction. Similarly, other factors may also influence traffic control at the junctions 210. For example, speed limits on the roads including the connecting road segments 212 can vary for each of the junctions 210. The junctions 210 may have additional variations, as well. By way of nonlimiting example, although the connecting roads 212 are generally illustrated as being arranged at right angles relative to adjacent segments, an angle between the road segments can vary. Moreover, individual of the junctions 210 may include crosswalks, bike lanes, physical barriers, or other features that can affect navigation therethrough. Other examples are provided herein.

Similarly, although the referenced connecting road segments 212 look substantially the same in the map 204, each may have unique features or attributes. By way of nonlimiting example, each segment may have a different curvature, a different grade, a different speed limit, a different number of lanes or lane configurations, e.g., widths, lengths or other extents, a different direction of travel for those lanes, or the like. Also in examples, the road segments 212 can include parking lanes, crosswalks, no parking zones, medians or other physical barriers, bridges, tunnels, adjacent sidewalks, speed bumps, bike lanes, or other features. Other examples are provided herein.

At operation 214, the process 200 may include comparing the segments to mapped segments and/or stereotypes using driving data. For example, each of the segments identified by the operation 208, e.g., each of the junctions 210 and each of the connecting road segments 212, may be compared to other junctions and connecting road segments. The driving data may be used to inform these comparisons. For instance, the driving data 206 may provide detailed sensor data about the extents, attributes, and/or features associated with the segments. In a specific example, the driving data may be used to confirm a speed limit and/or other traffic control features affecting the segment(s), as well as any other driving data associated (passenger comfort, compliance with additional traffic regulations, stopping distances, compliance with safety policies (providing sufficient margins in space and time with respect to other obstacles), and the like). The illustration accompanying the operation 214 demonstrates the first junction 210(1) from the map 204 and associated segment data 216. By way of nonlimiting example, the segment data 216 may include any of the features, attributes, and/or variations quantifiable for the junction 210(1), including but not limited to those discussed above. The associated segment data 216 can also include the driving data 206.

The example accompanying the operation 214 also shows example mapped junctions 218. For example, the mapped junctions 218 may include junction segments identified in a navigable region, such as in the map data 104. In some examples, each junction in the map data 104 can be individually stored with associated data, much like the segment data 216. In the example, a first mapped junction 218(1) shows a four-way intersection and associated data, a second mapped junction 218(2) shows a first three-way intersection and accompanying junction data, and a third mapped junction 218(3) shows a second three-way intersection and accompanying junction data. As noted, the mapped junctions 218 may be other segments of the map 204 and/or segments from other mapped areas. Accordingly, if at operation 214 it is determined that the junction 210(1) is the same as (or similar to) one of the mapped junctions 218, there may be reasonable expectation that the autonomous vehicle will operate similarly in those segments. Thus, for example, simulation scenarios used to test or verify one of the segments could also be used to test the other segment. In the example accompanying the operation 214, the junction 210(1) may be determined to be similar to and/or the same as the third mapped junction 218(3). Such similarity, may be determined based on, for example, a distance metric with respect to the features identified for each road segment. In at least some examples, confirmation and/or validation that a simulated scenario "passes" may be based on a comparison between the driving behavior, driving data, and similarity metric.

In some implementations, the operation 214 may compare the junction 210(1) to each mapped junction 218, as just described. In other implementations, however, each of the mapped junctions 218 may be representative of a class or group of similar junctions. By way of example, an autonomous vehicle may employ the same functionality to navigate through a four-way intersection of a major street and two side streets, e.g., regardless of whether the side streets have stop signs, yield signs, and/or flashing red lights and/or regardless of a speed limit of the major street. In such instances, the mapped junctions 218 may include junction or intersection classes or stereotypes. For example, an intersection stereotype can include one or more ranges or types of criteria within a single parameter. In some examples, an entire region, portion of a region, or otherwise may be validated for driving autonomously based on, for example, obtaining driving behavior for one segment and comparing against one or more simulations (which may be based on a segment type) in similar segments. In the example just given, similar four-way intersections of a major street and two side streets can be grouped together, regardless of the traffic control device used at the junction of the side streets with the major street (or of the traffic control device is a device on a list of similar devices) and/or regardless of a speed limit on the major street (or if the speed limit is within some range of speed limits). In some examples, using stereotypes can reduce computational load, e.g. by allowing for testing using fewer simulation scenarios and/or comparing segments to fewer maps segments, e.g., the mapped junctions 218. The use of stereotypes or classifications can reduce thousands of junctions to dozens of stereotypes, for example. In at least some examples where clustering algorithms are used to cluster segments, a mean, median, or mode of each cluster may be used as indicative of features of that segment with variances indicative of how tight each cluster is.

Although the example of FIG. 2 is directed to junctions or intersections, the similar techniques can be used to compare other segments, including but not limited to connecting road segments, like the road segments 110. Based on the results of such comparisons (e.g., with actual driving behavior), driving associated with one or more segments may be limited (either partially, or entirely) based on the comparison (such as not meeting or exceeding a threshold level of similarity) and/or additional real-world tests may be requested to determine actual driving behavior.

At operation 220, the process 200 may include identifying similar segments for simulation scenario generation and/or to generate/update stereotype(s). For example, the process 200 can include identifying that the junction 210(1) and the junction 210(3) are analogous (e.g. based on the comparison(s) at the operation 214). Accordingly, simulation scenarios used to test the first junction 210(1) may be used to test the third junction 210(3). Stated differently, because an autonomous vehicle may have already been tested in the first junction, e.g., using simulation scenarios, those same scenarios may also be used to test the autonomous vehicle at the second, similar junction. In at least some examples, such a determination may not be so binary (e.g., same or analogous vs. different or non-analogous). In such examples, based at least in part on a similarity metric, various certain simulation scenarios can be generated, e.g., to specifically test relative to the differences. In some examples, operations of a vehicle in those regions may be limited (e.g., a maximum speed limit, actions which can be performed, times and/or conditions in which autonomous driving is permitted, and the like). As a non-limiting example, if a road segment is within 95% of features of a second segment, similar driving features may be enabled. If, in another instance, a segment has a similarity metric of 0.8 of a stereotypical road segment, a maximum speed limit may be set which is a fraction of a posted speed limit of the new segment.

When two junctions, e.g., the first junction 210(1) and the third junction 210(3) are found to be sufficiently similar, the operation 220 can also generate and/or update a stereotype that encompasses both junctions. In examples, the stereotype can include information about attributes of the segment that define the stereotype and/or information about simulation scenarios applicable to the stereotype, as described herein.

Figure 3:
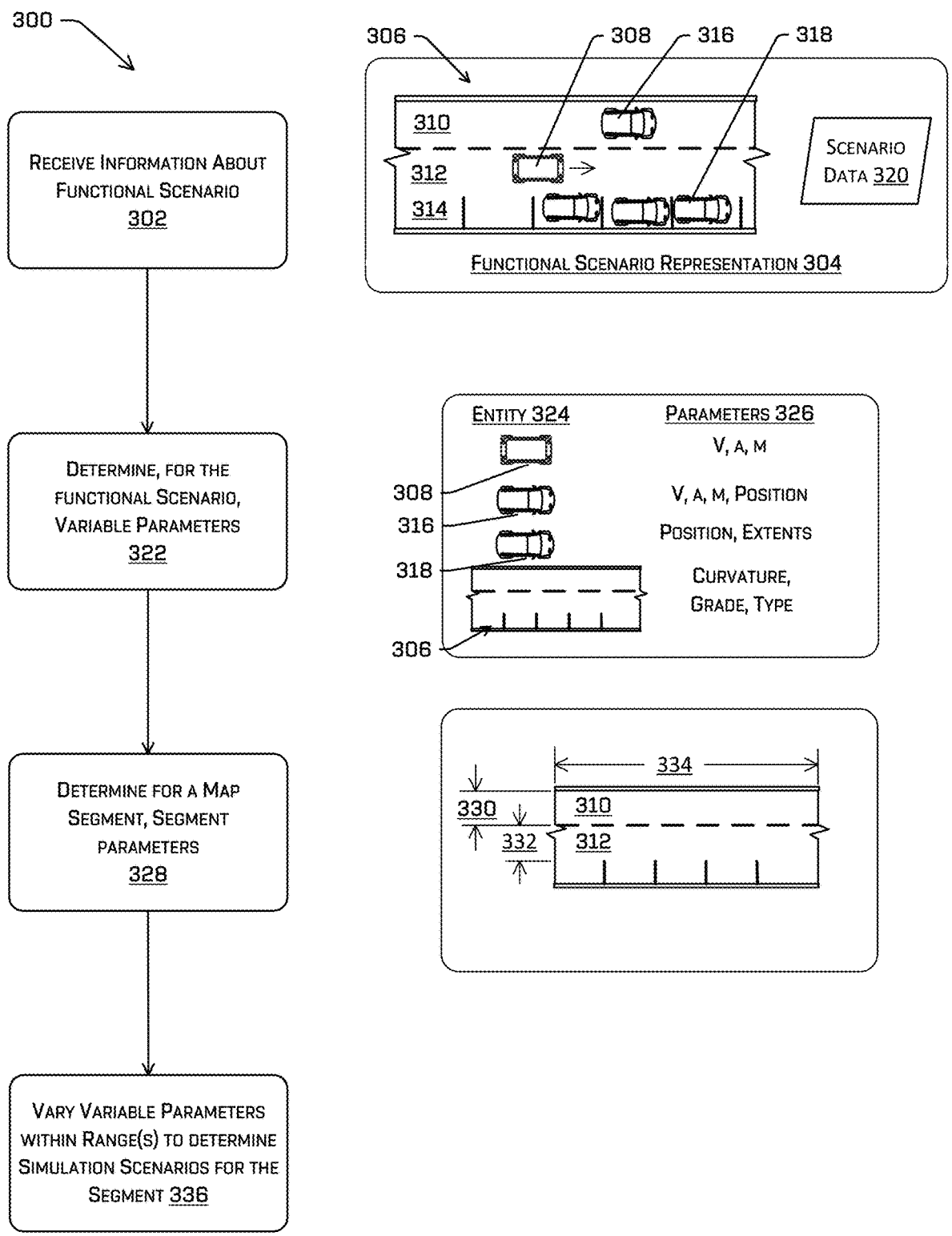
FIG. 3 includes textual and visual flowcharts to illustrate an example method for generating simulation scenarios for a drivable segment, according to aspects of this disclosure.

As noted above, the techniques described herein can be useful to determine, and in some instances, limit the number of simulation scenarios necessary for testing an autonomous vehicle control system in a simulated environment. For example, once simulated scenarios are generated for testing a first segment, those scenarios can also be used to test a second, similar segment. FIG. 3 illustrates an example of generating simulation scenarios for segments. More specifically, FIG. 3 depicts a pictorial flow diagram of an example process 300 for generating simulation scenarios from functional scenarios. For example, the process 300 may be implemented by one or more components of the scenario generation system 102, although the process 300 is not limited to use with the scenario generation system 102, and the scenario generation system 102 may perform operations and/or processes in addition to or instead of the process 300.

At operation 302, the process 300 may include receiving information about a functional scenario. For example, and as described further above, a functional scenario may be an embodiment of a behavior or outcome for controlling an autonomous vehicle. In some examples, a functional scenario can be a generic representation of an event, condition, or situation the autonomous vehicle may encounter. An example accompanying the operation 302 includes a functional scenario representation 304. The functional scenario representation 304 includes a representation of a drivable surface 306 and a representation of an autonomous vehicle 308 traveling on the drivable surface 306. In the example, the drivable surface 306 includes a first lane 310, second lane 312, in which the autonomous vehicle 308 is located, and a parking lane 314. As also illustrated, an additional vehicle 316 is in the first lane 310, and a plurality of parked cars 318 are parked in the parking lane 314. Accordingly, the functional scenario representation 304 provides a visual representation of a scenario. In at least some examples, such functional scenarios may be based at least in part on one or more segment features. As illustrated, the segment shown may correspond to various scenarios including parked vehicles exiting and entering parking lane 314, vehicle changing lanes into and/or out of a second lane 312, and the like.

As also illustrated in the example accompanying the operation 302, scenario data 320 may also be provided. In some examples, the scenario data 320 can include instructed behaviors for the autonomous vehicle 308, instructed behaviors for the additional vehicle 316 and/or the parked vehicles 318, or the like. In one example, the scenario data 320 may indicate that the autonomous vehicle 308 should drive through the mapped segment in the second lane 312. Generally, the functional scenario illustrated in the functional scenario representation 304 may represent a vehicle, e.g., the autonomous vehicle 308, traveling along a road segment.

At operation 322, the process 300 can include determining, for the functional scenario, variable parameters. For example, in the example accompanying the operation 322, entities 324 are illustrated together with parameters 326 that may be varied for the associated entity 324. In the example, the first entity 324 is the autonomous vehicle 308. For example, the autonomous vehicle 308, expected to stay in the lane 312, may have a variable velocity, a variable acceleration, and/or a variable mass, among other physical parameters associated with the autonomous vehicle 308. For instance, the velocity and/or acceleration can depend upon traffic control parameters, e.g., speed limits or the like, as well as other objects in the environment. Although the velocity, acceleration, and mass are provided as the parameters 326 associated with the autonomous vehicle 308, other parameters also may be included; the illustrated parameters 326 are for example only. As also shown in the example accompanying the operation 322, the additional vehicle 316 can have a variable velocity, variable acceleration, variable mass, and/or a variable position, the parked vehicles 318 can have variable positions and/or extents, and the drivable surface 306 can have variable curvature, grade, and or surface type (e.g., paved, gravel, dirt). Again, the parameters 326 are for example only. The entities 324 are for example only. For instance, more or fewer of the parked cars 318 may be present and more additional vehicle 316 also may be on the drivable surface 306. In some iterations of the functional scenario, the additional vehicle 316 and/or the parked vehicles 318 may not be present at all.

At operation 328, the process 300 can include determining for a map segment, segment parameters. For example, the example accompanying the operation 328 designates a first width 330 of the first lane 310 and a second width 332 of the second lane 312. A length 334 of the segment also is shown. For example, these parameters, as well as others, may be determined from driving data, e.g., generated from traveling on the represented road segment. Although not illustrated, the segment parameters can also include measurements of other characteristics or portions, including but not limited to, a curvature of the road segment or portions of the road segment, a grade (incline) of the road, extents of the parking spots in the parking lane, speed limits, positions of crosswalks, or the like.

At operation 336, the process 300 can vary the variable parameters within ranges to determine simulation scenarios for the segment. For example, multiple simulation scenarios can be generated from the functional scenario representation 304. For instance, the velocity and/or acceleration of the autonomous vehicle may be set at first values in a first scenario and second values and a second scenario. Similarly, a position of the additional vehicle 316 and/or a trajectory of the additional vehicle 316 can be modified to generate additional simulation scenarios. By perturbing one or more of the parameters, including the parameters 326 enumerated in FIG. 3, myriad simulation scenarios can be generated to test the vehicle control system in the specific segment having the segment parameters determined at the operation 328. As will be appreciated, a near infinite number of simulation scenarios can be determined for the single functional scenario illustrated in FIG. 3. Moreover, and as described herein, many functional scenarios can be enumerated.

In the context of this disclosure, the number of applicable simulation scenarios, necessary to adequately test an autonomous vehicle control system, may be limited by driving data acquired via driving on the to-be-tested segment and/or one or more segments deemed similar to the to-be-tested segment. By way of nonlimiting example, the driving data for a first segment can confirm similarity of that segment to another segment, thereby indicating that simulation scenarios may be applicable to both segments. Moreover, the number and extent of variations to the parameters 326 may be informed by the driving data. In some examples, the driving data may be used to re-create an exact scenario experienced while driving in a first region to another, similar region.

In at least some examples, similar segments (and/or the same segment with differing scenarios) in a map may be instantiated in simulation and a driving behavior may be compared to an actual driving behavior corresponding to a real-world scenario. Based at least in part on a difference between actual driving behavior and simulated driving behavior, the simulator may flag one or more portions of a map as having limited (partially and/or fully) driving behavior (e.g., instructing the vehicle not to perform certain maneuvers or actions (such as overtaking a double-parked vehicle), etc.). In some examples, a vehicle can be controlled according to these limited driving behaviors.

Figure 4:
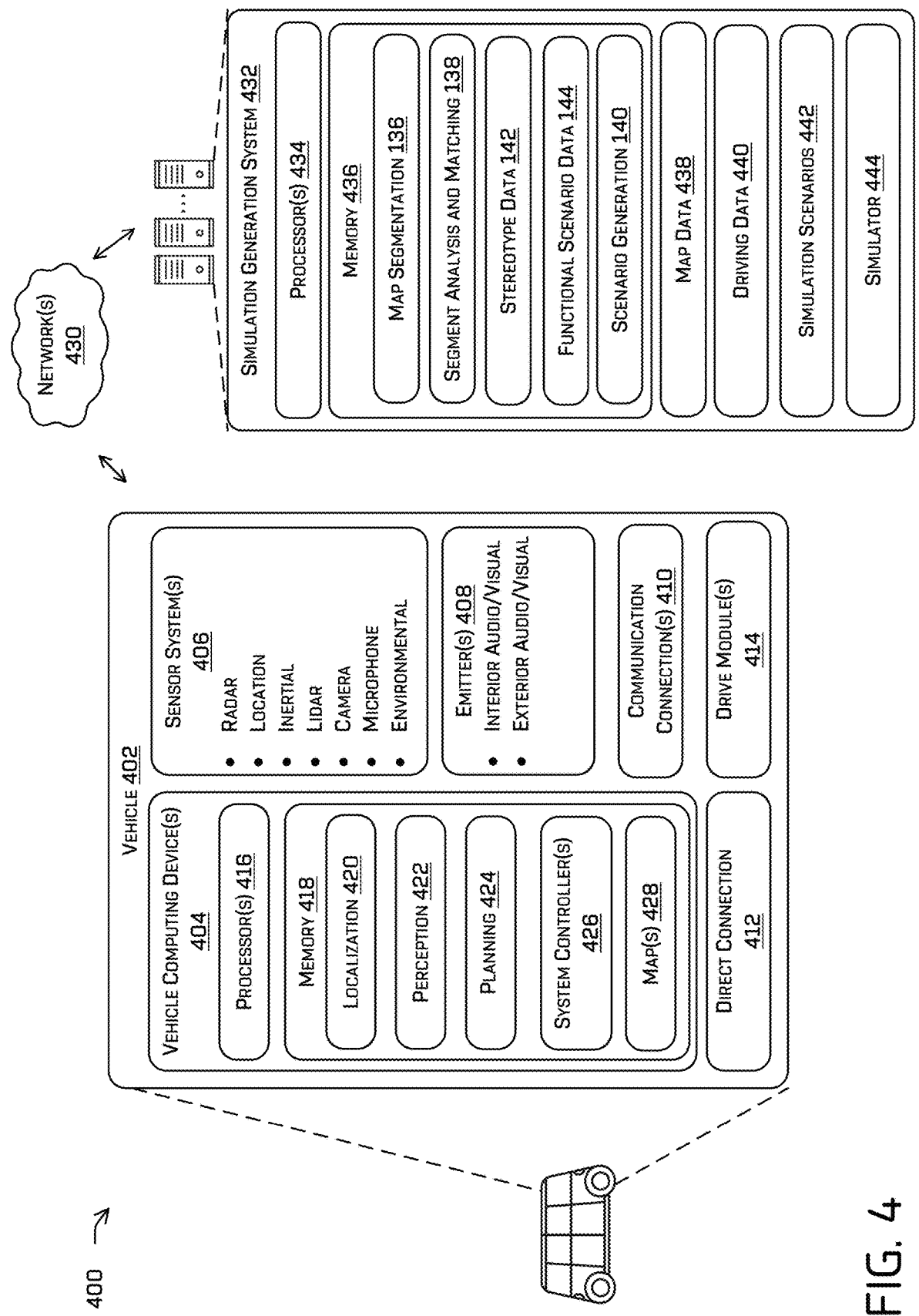
FIG. 4 is a block diagram illustrating example vehicle and remote computing systems for extending autonomous driving functionality to new regions, according to aspects of this disclosure.

FIG. 4 depicts a block diagram of an example system 400 for implementing the techniques described herein. In at least one example, the system 400 can include a vehicle 402, which be an autonomous vehicle such as autonomous vehicles described herein. The vehicle 402 can include a vehicle computing device 404, one or more sensor systems 406, one or more emitters 408, one or more communication connections 410, at least one direct connection 412, and one or more drive modules 414.

The vehicle computing device 404 can include one or more processors 416 and memory 418 communicatively coupled with the one or more processors 416. In the illustrated example, the vehicle 402 is an autonomous vehicle; however, the vehicle 402 could be any other type of vehicle, or any other system having at least an image capture device (e.g., a camera enabled smartphone). In the illustrated example, the memory 418 of the vehicle computing device 404 stores a localization component 420, a perception component 422, a planning component 424, one or more system controllers 426, and one or more maps 428. Though depicted in FIG. 4 as residing in memory 418 for illustrative purposes, it is contemplated that the localization component 420, the perception component 422, the planning component 424, the one or more system controllers 426, and the one or more maps 428 may additionally, or alternatively, be accessible to the vehicle 402. (e.g., stored remotely).

In at least one example, the localization component 420 can include functionality to receive data from the sensor system(s) 406 to determine a position of the vehicle 402. For example, the localization component 420 can include and/or request/receive a map of an environment and can continuously determine a location of the autonomous vehicle within the map. In some instances, the localization component 420 can utilize SLAM (simultaneous localization and mapping) or CLAMS (calibration, localization and mapping, simultaneously) to receive image data, LIDAR data, radar data, MU data, GPS data, wheel encoder data, and the like to accurately determine a location of the autonomous vehicle. In some instances, the localization component 420 can provide data to various components of the vehicle 402 to determine an initial position of an autonomous vehicle for generating a candidate trajectory, as discussed herein.

In some instances, the perception component 422 can include functionality to perform object detection, segmentation, and/or classification. In some examples, the perception component 422 can provide processed sensor data that indicates a presence of an entity that is proximate to the vehicle 402 and/or a classification of the entity as an entity type (e.g., car, pedestrian, cyclist, animal, building, tree, road surface, curb, sidewalk, unknown, etc.). In additional and/or alternative examples, the perception component 422 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

In general, the planning component 424 can determine a path for the vehicle 402 to follow to traverse through an environment. For example, the planning component 424 can determine various routes and trajectories and various levels of detail. For example, the planning component 424 can determine a route to travel from a first location (e.g., a current location) to a second location (e.g., a target location). For the purpose of this discussion, a route can be a sequence of waypoints for travelling between two locations. As non-limiting examples, waypoints include streets, intersections, global positioning system (GPS) coordinates, etc. Further, the planning component 424 can generate an instruction for guiding the autonomous vehicle along at least a portion of the route from the first location to the second location. In at least one example, the planning component 424 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique.

The system controller(s) 426 can be configured to control steering, propulsion, braking, safety, emitters, communication, and other systems of the vehicle 402. The system controller(s) 426 can communicate with and/or control corresponding systems of the drive module(s) 414 and/or other components of the vehicle 402.

The map(s) 428 that can be used by the vehicle 402 to navigate within the environment. For the purpose of this discussion, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map can include, but is not limited to: texture information (e.g., color information (e.g., RGB color information, Lab color information, HSV/HSL color information), and the like), intensity information (e.g., LIDAR information, RADAR information, and the like); spatial information (e.g., image data projected onto a mesh, individual "surfels" (e.g., polygons associated with individual color and/or intensity)), reflectivity information (e.g., specularity information, retroreflectivity information, BiWF information, BSSRDF information, and the like). In one example, a map can include a three-dimensional mesh generated using the techniques discussed herein. In some instances, the map can be stored in a tiled format, such that individual tiles of the map represent a discrete portion of an environment, and can be loaded into working memory as needed. In some example, the vehicle 402 can be controlled based at least in part on the map(s) 428. That is, the maps 428 can be used in connection with the localization component 420, the perception component 422, and/or the planning component 424 to determine a location of the vehicle 402, identify objects in an environment, and/or generate routes and/or trajectories to navigate within an environment. Moreover, data from the sensor system(s) 406 and/or other data can be used to augment, supplement, and/or generate map data included in the map(s) 428.

In some examples, the map(s) 428 may be stored on a remote computing device(s) (such as the computing device(s) 432) accessible via network(s) 430. In some examples, multiple of the map(s) 428 may be stored based on, for example, a characteristic (e.g., type of entity, time of day, day of week, season of the year, etc.). Storing multiple maps 428 may have similar memory requirements, but increase the speed at which data in a heat map may be accessed.

In some instances, aspects of some or all of the components discussed herein may include any models, algorithms, and/or machine learning algorithms. For example, in some instances, the components in the memory 418 (and the memory 436, discussed below) may be implemented as a neural network.

As described herein, an exemplary neural network is a biologically inspired algorithm which passes input data through a series of connected layers to produce an output. Each layer in a neural network may also comprise another neural network, or may comprise any number of layers (whether convolutional or not), As may be understood in the context of this disclosure, a neural network may utilize machine learning, which may refer to a broad class of such algorithms in which an output is generated based on learned parameters.

Although discussed in the context of neural networks, any type of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (MN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis ((SDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GRT), Random Forest), SVM (support vector machine), supervised learning, unsupervised learning, semi-supervised learning, etc.

Additional examples of architectures include neural networks such as ResNet70, ResNet101, VGG, Dens Net, PointNet, and the like.

In at least one example, the sensor system(s) 406 can include LIDAR sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RCB, IR, intensity, depth, time of flight, etc.), microphones, wheel encoders, environment sensors (e.g., temperature sensors, humidity sensors, light sensors, pressure sensors, etc.), etc. The sensor system(s) 406 can include multiple instances of each of these or other types of sensors. For instance, the LIDAR sensors can include individual LIDAR sensors located at the corners, front, back, sides, and/or top of the vehicle 402. As another example, the camera sensors can include multiple cameras disposed at various locations about the exterior and/or interior of the vehicle 402. The sensor system(s) 406 can provide input to the vehicle computing device 404. Additionally, or alternatively, the sensor system(s) 406 can send sensor data, via the one or more networks 430, to the one or more computing device(s) at a particular frequency, after a lapse of a predetermined period of time, in near real-time, etc.

The emitter(s) 408 may be configured to emit light and/or sound. The emitter(s) 408 in this example can include interior audio and visual emitters to communicate with passengers of the vehicle 402. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 408 in this example also include exterior emitters. By way of example and not limitation, the exterior emitters in this example can include lights to signal a direction of travel or other indicator of vehicle action (e.g., indicator lights, signs, light arrays, etc.) and/or one or more audio emitters (e.g., speakers, speaker arrays, horns, etc.) to audibly communicate with pedestrians or other nearby vehicles, one or more of which can include acoustic beam steering technology.

The communication connection(s) 410 can enable communication between the vehicle 402 and one or more other local or remote computing device(s), such as the computing device(s) 432. For instance, the communication connection(s) 410 can facilitate communication with other local computing device(s) on the vehicle 402 and/or the drive module(s) 414. Also, the communication connection(s) 410 can allow the vehicle to communicate with other nearby computing device(s) (e.g., other nearby vehicles, traffic signals, etc.). The communications connection(s) 410 also enable the vehicle 402 to communicate with a remote teleoperations computing device or other remote services.

The communications connection(s) 410 can include physical and/or logical interfaces for connecting the vehicle computing device 404 to another computing device or a network, such as the network(s) 430. For example, the communications connection(s) 410 can enable Wi-Fi-based communication such as via frequencies defined by the IEEE 402.11 standards, short range wireless frequencies such as Bluetooth®, cellular communication (e.g., 2G, 3G, 4G, 4G, 4G LTE, 5G, etc. or any suitable wired or wireless communications protocol that enables the respective computing device to interface with the other computing device(s).

The drive module(s) 414 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive module(s) 414 can include a drive module controller which can receive and preprocess data from the sensor system(s) and to control operation of the various vehicle systems. In some examples, the drive module controller can include one or more processors and memory communicatively coupled with the one or more processors. The memory can store one or more modules to perform various functionalities of the drive module(s) 414. Furthermore, the drive module(s) 414 also include one or more communication connection(s) that enable communication by the respective drive module with one or more other local or remote computing device(s).

In some examples, the vehicle 402 can have a single drive module 414. In at least one example, if the vehicle 402 has multiple drive modules 414, individual drive modules 414 can be positioned on opposite ends of the vehicle 402 (e.g., the front and the rear, etc.). In at least one example, the drive module(s) 414 can include one or more sensor systems to detect conditions of the drive module(s) 414 and/or the surroundings of the vehicle 402. By way of example and not limitation, the sensor system(s) can include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, LIDAR sensors, radar sensors, etc. Some sensors, such as the wheel encoders can be unique to the drive module(s) 414. In some cases, the sensor system(s) on the drive module(s) 414 can overlap or supplement corresponding systems of the vehicle 402 (e.g., sensor system(s) 406).

In at least one example, the localization component 420, the perception component 422, and/or the planning component 424 can process sensor data, as described above, and can send their respective outputs, over the network(s) 430, to the computing device(s) 432. In at least one example, the localization component 420, the perception component 422, and/or the planning component 424 can send their respective outputs to the one or more computing device(s) 432 at a particular frequency, after a lapse of a predetermined period of time, in near real-time, etc. In some examples, the vehicle 402 can send raw sensor data to the computing device(s) 432. In other examples, the vehicle 402 can send processed sensor data and/or representations of sensor data to the computing device(s) 432. In some examples, the vehicle 402 can send sensor data to the computing device(s) 432 at a particular frequency, after a lapse of a predetermined period of time, in near real-time, etc. In some cases, the vehicle 402 can send sensor data (raw or processed) to the computing device(s) 432 as one or more log files.

In at least some examples, the computing device(s) 432 can include one or more processors 434 and memory 436 communicatively coupled with the one or more processors 434. The computing device(s) 432 also may include map data 438, driving data 440, simulation scenarios 442, and a simulator 444. Also in the illustrated example, the memory 436 of the computing device(s) 432 stores the map segmentation component 136, the segment analysis and matching component 138, and the scenario generation component 140. In at least one example, the computing device(s) 432 can include some or all of the functionality of the scenario generation system 102 of FIG. 1.

The map segmentation component 136 is described above in connection with FIG. 1. In general, the map segmentation component can include feature identification components and/or a machine learning algorithm trained to identify segments of a drivable surface. In some cases, the map segmentation component 136 can receive map data, such as the map data 438 and/or driving data, such as the driving data 440, and analyze the data to determine segments, such as connecting road segments and junction segments at which connecting road segments converge. Also in implementations, the map segmentation component 136 can identify sub-regions of segments, including, but not limited to, lane combinations, portions of intersections, or the like.

The segment analysis and matching component 138 is described above in connection with FIG. 1. In general, the segment analysis and matching component 138 can compare map segments to determine similarities. For example, the segment analysis and matching component 138 may determine whether a first segment identified from map data and/or driving data is analogous or similar to another segment. As described herein, an autonomous vehicle may be expected to operate similarly in similar regions, and thus certain economies can be gained by identifying similar regions. By way of non-limiting example, simulation scenarios, such as the simulation scenarios 442 used to verify conformance of an autonomous vehicle control system with a first segment may also be used to verify the autonomous vehicle control system in a second, similar segment.

In some instances, the segment analysis and matching component 138 can also compare map segments from map data to stereotypes of segment classes. For instance, and as described herein, stereotypes, such as the stereotype data 142 can be used to group segments on which a vehicle may function (or has proven to operate) in the same or a similar manner. Moreover, the segment analysis and matching component 138 may generate and/or update the stereotype data 142, e.g., when it is determined that a vehicle does not perform as expected.

The scenario generation component 140 is described above in connection with FIG. 1, In general, the scenario generation component 140 can automatically generate simulation scenarios 442 to test an autonomous vehicle control system in a simulated environment approximating a segment of a drivable surface. In examples, the scenario generation component 140 generates the simulation scenarios 442 based on a similarity of the segment to another segment, e.g., a segment on which testing has already been accomplished. In some situations, the scenario generation component 140 can generate a subset of a relatively larger number of simulation scenarios based on the similarity of the segments. Also in examples, the simulation generation component 140 can store or otherwise associate generated simulation scenarios 442 with stereotypes representative of one or more classes of segments. Moreover, and as described herein, the simulation generation component 140 can generate the simulation scenarios 442 using driving data, e.g., sensor data generated by sensors mounted on a vehicle traversing on the drivable surface. In some examples, using the driving data can provide more accurate and/or realistic scenarios, e.g., by modeling scenarios in one area based on observed events from another, similar segment.

In the example of FIG. 4, the map data 438 may be the map data 104 and may be similar to or the same as some or all of the map(s) 428 described above. For instance, the map data 438 may be detailed map data associated with a region in which the vehicle 402 can operate autonomously. As noted herein, the map data 438 can include 2D or 3D data and may be used by the localization component 420, the planning component 424, and/or other components of the vehicle 402 to navigate one the drivable surface.

The driving data 440 may be the driving data 106. In some examples, the driving data 440 can include sensor data generated by the one or more sensor systems 406. In examples, the driving data 440 may be used to confirm similarity of segments of the drivable surface and/or to inform scenario generation. Also in examples, the driving data 440 may be used to disprove the similarity of segments. For example, it may be expected that the autonomous vehicle 402 will perform similarly in segments determined to be similar. However, in some instances, the driving data 440 can indicate that an expected outcome was not achieved. That is, the determination of segments as being similar can be based on assumption, and the driving data 440 can be used to confirm or refute that assumption. In at least some examples, the driving data 440 may be any other representation of sensor data and/or higher level data (e.g., feedback from a passenger regarding passenger comfort, etc.) used to validate performance of a vehicle in a particular road segment.

The simulator 444 can include functionality to perform tests using the simulation scenarios 442. In some examples, the simulator 444 can simulate processing associated with one or more components of the vehicle 402, e.g., to determine responses of the vehicle computing device(s) 404 to simulation scenarios. For example, the simulator 444 can store or otherwise access performance parameters, e.g., which may describe preferred functioning for the autonomous vehicle 402, and determine whether the vehicle computer device(s) function, e.g., in response to the simulation scenarios 442, in a manner that complies the parameters. In examples, the simulator 444 can determine outcomes of simulations, e.g., by determining vehicle trajectories or the like resultant from processing conducted by the vehicle computing device(s) 404. In at least some examples, validation for segments may be determined based on a similarity between segments and/or the driving data 440 associated therewith. In at least several examples, driving functions may be limited (and in some cases disabled) based on differences between simulated outcomes and associated driving data which, in some cases may further depend on a similarity, between the segment associated with the driving data 440 and the currently simulated segment.

The processor(s) 416 of the vehicle 402 and the processor(s) 434 of the computing device(s) 432 can be any suitable processor capable of executing instructions to process data and perform operations as described herein. By way of example and not limitation, the processor(s) 416, 434 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 418 and the memory 436 are examples of non-transitory computer-readable media. The memory 418 and the memory 436 can store an operating system and one or more software applications, instructions, programs, and/ or data to implement the methods described herein and the functions attributed to the various systems. In various implementations, the memory can be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 4 is illustrated as a distributed system, in alternative examples, components of the vehicle 402 can be associated with the computing device(s) 432 and/or components of the computing device(s) 432 can be associated with the vehicle 402. That is, the vehicle 402 can perform one or more of the functions associated with the computing device(s) 432, and vice versa.

Figure 5:
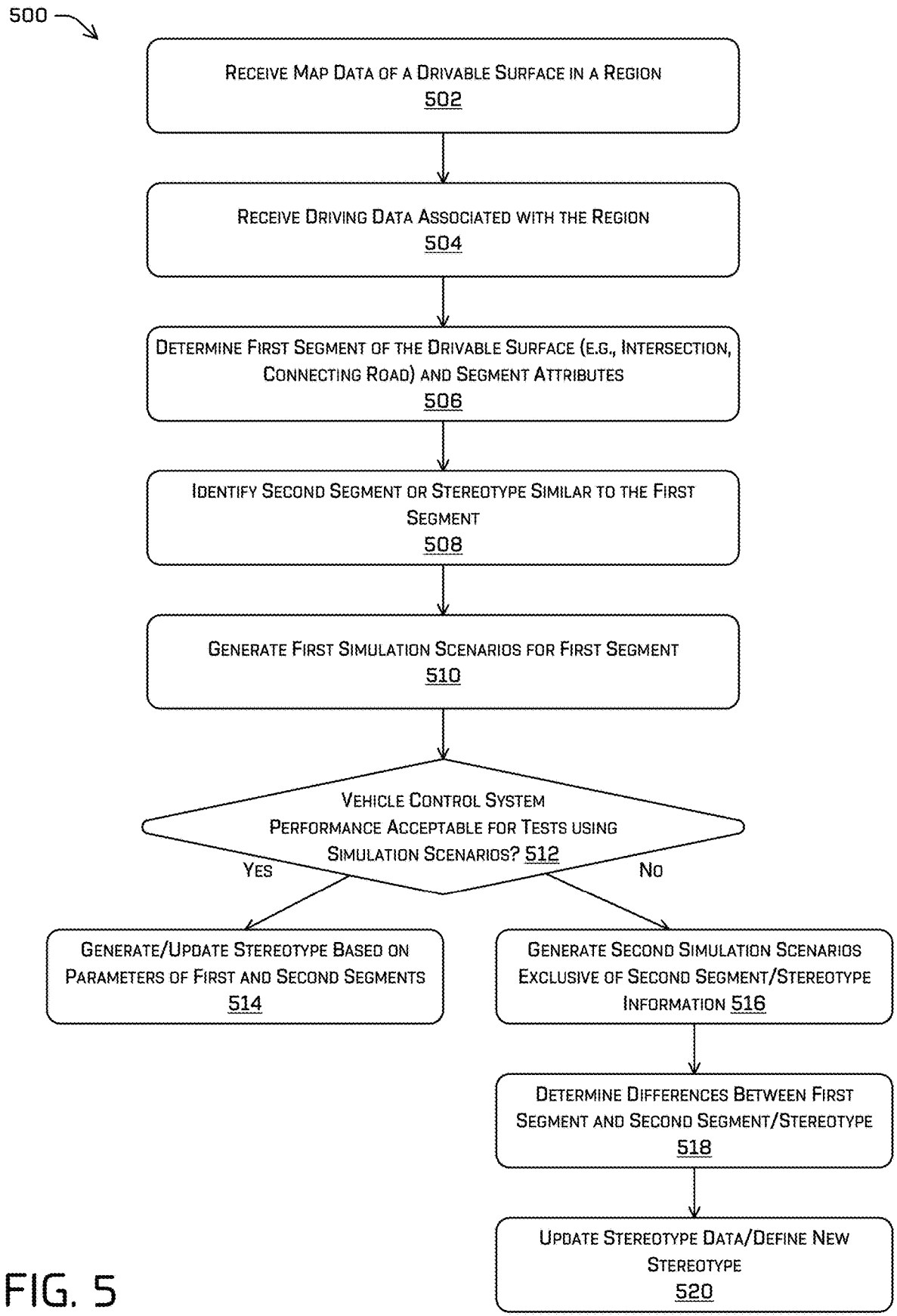
FIG. 5 is a flow chart representative of one or more processes for testing autonomous vehicle systems, according to aspects of this disclosure.

FIGS. 2, 3, and 5 illustrate example processes in accordance with embodiments of the disclosure. These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

FIG. 5 depicts an example process 500 for testing autonomous vehicle control systems using map data and driving data. For example, some or all of the process 500 can be performed by one or more components in FIG. 4, as described herein. For example, some or all of the process 500 can be performed by the computing device(s) 432 and/or the autonomous vehicle 402.

At operation 502, the process 500 can include receiving map data of a drivable surface in a region. For example, an autonomous vehicle, such as the vehicle 402, may require extensive and detailed map data to navigate autonomously in an environment. For example, such map data may include information about the drivable surface. In other examples, the map data can further include three-dimensional mesh data of objects in the mapped region, including but not limited to drivable surfaces, obstructions, buildings, curbs, or the like. Moreover, such map data may include any information and/or data that can affect travel on the drivable surfaces. For instance, the map data may include speed limit information, traffic control information, and/or any other information required to travel safely and/or legally through the verified region.

At operation 504, the process 500 can include receiving driving data associated with the region. For example, and as noted above with regard to FIG. 4, an autonomous vehicle, like the vehicle 402, may include one or more sensors and/or sensor modalities configured to generate data about an environment of the vehicle 402. In some instances, as the vehicle traverses along a drivable surface of a region, the sensors will generate information about the environment. Such sensor data may be three-dimensional data, image data, or the like. In some examples, the driving data may also include information about objects in the environment of the vehicle. For example, techniques described herein can use the driving data to inform segment matching and/or simulation scenario generation. In at least some examples, such driving data may be higher-level data (e.g., representative of objects, road surfaces, etc.) and/or meta-data (data indicative of passenger comfort levels, accelerations, jerk, etc.).

At operation 506, the process 500 can include determining a first segment of the drivable surface and segment attributes. For example, the map segmentation component 136 can identify segments as portions of the drivable surface and surrounding attributes. By way of nonlimiting example, such segments may include junctions of connecting roads and/or connecting roads extending between junctions. In some implementations a segment may be a subset of a junction and/or a connecting road segment. The attributes of the first segment can include physical attributes of the first segment and/or traffic control parameters associated therewith. In some examples, the attributes of the first segment may be discerned from the driving data. For example, sensor data generated by sensors mounted on a vehicle traversing the drivable surface can be used to determine attributes of the drivable surface and/or elements affecting or otherwise associated therewith. In some examples, segments may be determined as those portions of a drivable surface having a similar set of features (lanes, width, speed limit, grade, curvature, etc.). In at least some examples, all such identified portions may be clustered according to one or more clustering techniques and a representative segment (stereotype) may be identified as representative of all segments in a cluster. In some examples, the representative segment may be a mean, median, mode, or other statistical combination of segments in a cluster.

At operation 508, the process 500 may include identifying a second segment or a stereotype similar to the first segment. For example, the segment analysis and matching component 138 can determine another segment, e.g., in the region or otherwise mapped, that is an analog or otherwise similar. For example, the segment analysis and matching component 138 may determine a similarity score or other metric (e.g., a Euclidian distance between features, which may be weighted). In some examples, the segment analysis and matching component 138 may determine whether values associated with certain parameters or attributes of the first segment comport with those features/attributes in the second segment, as descried herein in some examples, stereotypes or classifications may be used to describe a number or range of segments (e.g., segments belonging to a same cluster, within a threshold similarity, or the like). In such examples, the operation 508 may include identifying a stereotype for classification to which the first segment relates. In some examples of this disclosure, the similarity of two segments and/or of a segment to a stereotype or classification may be based at least in part on the driving data received at the operation 504. By way of nonlimiting example, techniques described herein can determine whether an autonomous vehicle driving in the region operated similarly in the first segment and the second segment. Moreover, attributes associated with the region can be determined from the driving data, and compared to the stereotypes or classifications.

At operation 510, the process 500 can include generating first simulation scenarios for the first segment. In some examples, simulation scenarios may have been previously generated for the second segment to which the first segment has been deemed similar and/or for the stereotype with which the first segment comports. In at least some examples, a set of one or more functional scenarios may be associated with various particular segments. The operation 510 may include re-creating those simulation scenarios in a simulation environment including attributes of the second segment. Moreover, in some examples, the simulation scenarios for the second segment may be generated using the driving data. In one example, objects, behaviors, and/or situations encountered while driving in the first segment (or some other similar segment) may be re-created in the second segment via simulation scenarios. As described herein, because of the association of the first segment with the second segment and/or the stereotype, techniques described herein may reduce or obviate the need to generate new simulation scenarios to test each segment of a drivable surface.

At operation 512, the process 500 may include determining whether a vehicle control system performs acceptably in tests using the simulation scenarios. For example, although the simulation scenarios may be chosen based on an expectation that the vehicle control system will perform acceptably in the first segment, e.g., because the simulation scenarios are based at least in part on a similarity of the first segment to a second segment and/or to a stereotype, implementations of this disclosure run simulations applying the simulation scenarios to the first segment. In some examples, acceptable operation may include the vehicle control system simulating from a start or origination location to a destination location while passing through the first segment. In other examples, acceptable operation may include a temporal component, e.g., a determination that the simulated vehicle traveled from the origination to the destination in a specific time. Acceptable performance may also consider whether the simulated vehicle conforms to other driving parameters, including, but not limited to safety parameters, an amount of processing required, an amount of CPU usage, an amount of memory usage, and the like. In some examples, safety, parameters can include maintaining a minimum distance from objects in the environment, maintaining it time gap between elite vehicle and the simulated vehicle, maintaining a time to collision with other objects in the simulated environment at or below the threshold time, or other parameters. In still further examples, parameters affecting passenger comfort may be assessed to determine whether the vehicle performed acceptably. For instance, a number and severity of accelerations and decelerations, a severity of maneuvering returning, or the like as the vehicle is simulated through the segment may also be considered. In some examples, driving data as described herein may also include passenger feedback about travel through a region or segment, and such data may be used in simulations and/or when validating performance. In at least some examples, determination of a valid segment is determined by simulating a scenario with respect to the segment (which may comprise a functional scenario) to determine a set of vehicle states and controls and comparing such controls and states to the driving data, wherein a threshold is determined based on how similar the segment is to the segment associated with the driving data.

If, at the operation 512 it is determined that the vehicle performs acceptably for the tests using the simulation scenarios, at operation 514, the process 500 can include generating/updating stereotypes based on parameters of the first and second segments. For example, acceptable performance in the simulated environment may serve as verification that the first segment was in fact similar to the second segment and/or the stereotype. Accordingly, the operation 514 may include associating the first segment with the existing stereotype. In instances in which a stereotype has not been created, attributes of the first segment and the second segment may be classified or otherwise categorized to form a new stereotype. In examples, differences between attributes or parameters of the first segment and the second segment may be identified and quantified. In some examples, a stereotype may be a range including both of the different attributes/parameters.

Alternatively, if at the operation 512 it is determined that the vehicle does not perform acceptably in tests based on the simulation scenarios, at operation 516, the process 500 can include generating second simulation scenarios exclusive of the second segment or stereotype information. For instance, failure of the vehicle control system to perform acceptably may indicate that the first segment is/was not similar to the second segment and/or the stereotype. In some implementations, the operation 516 can include implementing some or all of the process 300 to generate new simulation scenarios based on functional scenarios.

Moreover, at operation 518, the process 500 may also include determining differences between the first segment and the second segment and/or the stereotype. For example, although the operation 508 may include determining that the first segment was similar to the second segment and or a stereotype, the first segment will invariably have one or more differences from the second segment and/or the stereotype. The operation 518 may identify those differences. In at least some examples, differences may be indicative of a limitation in maneuvers and/or actions available for the vehicle with respect to such a segment and/or limiting driving completely. In some examples, additional driving data may be collected from the segment in order to validate, or otherwise determine the need for additional data.

Then, at the operation 520, the process 500 can include updating the stereotype data and/or defining a new stereotype. For example, when the vehicle control system does not perform as expected in tests using the simulation scenarios determined based at least in part on similarity of the first segment to another segment or stereotype, it may be determined that the differences between the segment and the segment or stereotype are significant enough to disassociate the first segment from the second segment and/or the stereotype. Accordingly, in some instances, the techniques described herein can update stereotype data, e.g., such that a value or attribute associated with the first segment is no longer included in the stereotype. In other examples, other, e.g., not previously considered attributes, may also be considered. When such a new or divergent attribute is identified, a new stereotype may be generated to include a different range of value associated with that attribute.

Thus, according to the techniques described herein, testing of vehicle control systems in segments of a drivable region may be streamlined. For example, map data of a region and driving data captured while traveling to the region can be used to determine segments of the region and similarities between some of those segments. In implementations, the similarities may allow for the generation of stereotypes and/or Association of simulation scenarios that can be used to simulate testing and those similar regions. In some implementations, by creating stereotypes and/or identifying similarities, a number of simulation scenarios can be reduced.

Example Clauses

A: An example computer-implemented method for generating simulation scenarios; the computer-implemented method comprising: receiving map data about a region including a drivable surface; receiving driving data generated by a vehicle driving in a portion of the region; determining, based at least in part on the map data, a plurality of segments of the region, a first segment of the plurality of segments including a first portion of the drivable surface and having first attributes associated with the first portion; determining, based at least in part on the map data; a second segment of the plurality of map segments, the second segment including a second portion of the drivable surface and having second attributes associated with the second portion; determining a difference between the second attributes and the first attributes; determining that the difference is less than or equal to a threshold difference; generating, based at least in part on information associated with the first segment, a plurality of simulation scenarios for testing a vehicle control system in the second segment; and validating a vehicle control system using the plurality of simulation scenarios and based at least in part on the driving data.

B: The computer-implemented method of example A, further comprising: determining, based at least in part on the difference, that a performance of the vehicle control system meets or exceeds one or more performance thresholds.

C: The computer-implemented method of example A or example B, wherein the plurality of simulation scenarios comprise a plurality of second segment simulation scenarios, the method further comprising: determining a functional scenario associated with the first segment, the functional scenario comprising an autonomous vehicle maneuver and scenario information about an object or a condition associated with the autonomous vehicle maneuver; and determining a plurality of first segment simulation scenarios based at least in part on the functional scenario, wherein the plurality of second segment simulation scenarios are based at least in part on the plurality of first segment simulation scenarios.

D: The computer-implemented method of any one of example A through example C, wherein the driving data comprises information about one or more objects in the first region, sensor data from one or more sensors, representative data, or passenger feedback data and the one or more the plurality of simulations scenarios simulate the one or more objects from the first region in the second region.

E: The computer-implemented method of any one of example A through example D, wherein the difference is a first difference, the method further comprising: determining, based at least in part on the plurality of simulation scenarios, simulated driving data; determining a second difference between the simulated driving data and the based at least in part on the second, associating one or more control limitations for the vehicle associated with the second segment.

F: An example system comprising: one or more processors; and one or more non-transitory computer-readable media storing instructions executable by the one or more processors, wherein the instructions program the one or more processors to perform acts comprising: determining, from map data about a region, a plurality of map segments; determining a plurality of first segment simulation scenarios for a first segment of the plurality of map segments, the first segment corresponding to a first portion of the region; receiving driving data generated by a vehicle driving in the first portion of the region; identifying a second segment of the plurality of map segments, the second segment having at least one second attribute corresponding to at least one first attribute of the first segment; and generating, based at least in part on the plurality of first segment simulation scenarios, a plurality of second segment simulation scenarios; validating, based at least in part on the plurality of second segment simulation scenarios and the driving data, a vehicle control system in the second segment.

G: The system of example F, wherein the determining the plurality of first simulation scenarios comprises: receiving a plurality of functional scenarios with the first segment, a functional scenario of the plurality of functional scenarios comprising an autonomous vehicle maneuver and at least one of an object or a condition associated with the autonomous vehicle maneuver; associating a first functional scenario of the plurality of functional scenarios and a second functional scenario of the plurality of functional scenarios with the first segment; generating, for the first segment, first simulation scenarios corresponding to the first functional scenario; and generating, for the first segment, second simulation scenarios corresponding to the second functional scenario, wherein the plurality of first segment simulation scenarios comprise the first simulation scenarios and the second simulation scenarios.

H: The system of example F or example G, wherein the determining the first simulation scenarios comprises: determining at least one of a vehicle parameter, an environmental parameter, or an object parameter associated with the first functional scenario; determining, for the at least one of the vehicle parameter, the environmental parameter, or the object parameter, a set of values; determining a first of the plurality of first simulation scenarios based at least in part on a first value of the set of values; and determining a second of the plurality of first simulation scenarios based at least in part on a second value of the set of values.

I: The system of any one of example F through example H, wherein the driving data comprises one or more of information about historical object behaviors at the first map segment, sensor data from one or more sensors, or passenger feedback associated with the first map segment.

J: The system of any one of example F through example I, wherein the information about historical object behaviors comprises one or more object behavior models associated with the historical object behaviors in the first region, and wherein the plurality of second segment simulation scenarios include information about simulated objects behaving according to the one or more object models.

K: The system of any one of example F through example J, the acts further comprising: determining a first difference between the first set of attributes and the second set of attributes; determining a second difference between the driving data and simulated driving data associated with a second simulated scenario; determining, based at least in part on one or more of the first difference or the second difference, a limitation for controlling the vehicle in the second segment.

L: The system of any one of example F through example K, wherein determining the plurality of map segments comprising clustering portions of the map based at least in part on one or more attributes.

M: The system of any one of example F through example L, wherein the identifying the second segment comprises determining that the second segment conforms to a segment stereotype associated with the first segment, the method further comprising: determining a response of a vehicle control system to the plurality of second simulation scenarios; and based at least in part on an outcome of the response of the vehicle control system to the plurality of second simulation scenarios, updating the segment stereotype.

N: The system of any one of example F through example M, wherein the updating the segment stereotype comprises: determining a difference between the first attribute and the second attribute; and based at least in part on the difference, modifying a value or range of values associated with the segment stereotype.

O: The system of any one of example F through example N, wherein the first attributes and the second attributes comprise at least one of a speed limit for the road segment, a width of at least a portion of the road segment, a number of lanes in the road segment, non-drivable regions in the road segment, an incline of the road segment, a curvature, or a permitted type of travel on lanes in the road segment.

P: The system of any one of example F through example O, wherein the first segment and the second segment comprise road segments extending between junctions and the first attributes and the second attributes comprise at least one of a number of road segments joining at the intersection, an angle between road segments joining at the intersection, traffic control information at a termination of the road segments at the intersection, or information about object crossings at the intersection.

Q: An example one or more non-transitory computer-readable media storing instructions that, when executed, cause one or more processors to perform operations comprising: determining, from map data about a region, a plurality of map segments; determining a plurality, of first segment simulation scenarios for a first segment of the plurality of map segments, the first segment corresponding to a first portion of the region; receiving driving data generated by a vehicle driving in the first portion of the region; identifying a second segment of the plurality of map segments, the second segment having at least one second attribute within a threshold distance of a first attribute of the first segment; and generating, based at least in part on the plurality of first segment simulation scenarios, a plurality of second segment simulation scenarios for testing a vehicle control system in the second segment; validating the second segment based at least in part on the driving data and the plurality of second segment simulation scenarios.

R: The non-transitory computer-readable media of example Q, wherein the generating the plurality of simulation scenarios comprises: receiving a plurality of functional scenarios, a functional scenario of the functional scenarios comprising an autonomous vehicle maneuver and at least one of an object or a condition associated with the autonomous vehicle maneuver; associating a first functional scenario of the plurality of functional scenarios with the second segment; generating the simulation scenarios based at least in part on the first functional scenario.

S: The non-transitory computer-readable media of example Q or example R, wherein validating the second segment comprises: determining a first difference between the first attribute and the second attribute; determining a set of driving behaviors and states associated with the plurality of second segment simulation scenarios; determining a second difference between the set of driving behaviors and the driving data; and determining one or more vehicle control limitations based at least in part on one or more of the first difference or the second difference.

T: The non-transitory computer-readable media of any one of example Q through example 5, wherein: the driving data comprises one or more object behavior models associated with historical object behaviors in the first region, sensor data from one or more sensors on the vehicle, or passenger feedback.

Conclusion

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily, departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations described herein need not be performed in the order disclosed, and other examples using alternative orderings of the computations could be readily implemented. In addition to being reordered, in some instances, the computations could also be decomposed into sub-computations with the same results.

What is claimed is:

1. A computer-implemented method for generating simulation scenarios, the computer-implemented method comprising:
   receiving map data about a region including a drivable surface;
   receiving driving data generated by a vehicle driving in a portion of the region, the driving data including object interactions within an environment of the vehicle;
   determining, based at least in part on the map data, a plurality of road segments of the region, a first road segment of the plurality of road segments including a portion of the drivable surface and having first attributes associated with the first road segment;
   determining, based at least in part on the map data, a second road segment of the plurality of road segments, the second road segment having second attributes associated with the second road segment;
   determining, based at least in part on the first attributes and the second attributes, a difference between the first road segment and the second road segment;
   determining that the difference is less than or equal to a threshold difference;
   determining, based at least in part on the difference being less than or equal to the threshold difference, that the object interactions are applicable for testing a vehicle control system in the second road segment;
   generating, based at least in part on the difference being less than or equal to the threshold difference, a plurality of simulation scenarios for testing the vehicle control system in the second road segment, wherein a scenario of the plurality of simulation scenarios is based at least in part on the object interactions; and
   validating the vehicle control system using the plurality of simulation scenarios.

2. The computer-implemented method of claim 1, further comprising:
   determining, based at least in part on the difference, that a performance of the vehicle control system meets or exceeds one or more performance thresholds.

3. The computer-implemented method of claim 2, wherein the plurality of simulation scenarios comprise a plurality of first simulation scenarios, the method further comprising:
   determining a functional scenario associated with the first road segment, the functional scenario comprising an

33 autonomous vehicle maneuver and scenario information about an object or a condition associated with the autonomous vehicle maneuver; and determining a plurality of second simulation scenarios based at least in part on the functional scenario, wherein the plurality of first simulation scenarios are based at least in part on the plurality of second simulation scenarios.

4. The computer-implemented method of claim 1, wherein the driving data comprises information about one or more objects in the first road segment, sensor data from one or more sensors, representative data, or passenger feedback data and the plurality of simulation scenarios simulate the one or more objects from the first road segment in the second road segment.

5. The computer-implemented method of claim 1, wherein the difference is a first difference, the method further comprising:

determining, based at least in part on the plurality of simulation scenarios, simulated driving data;

determining a second difference between the simulated driving data and the driving data; and based at least in part on the second difference, associating one or more control limitations for the vehicle associated with the second road segment.

6. The computer-implemented method of claim 1, wherein:

the object interactions are first object interactions; and the first object interactions are simulated as second object interactions associated with the second road segment for testing the vehicle control system in the second road segment.

7. A system comprising:

one or more processors; and one or more non-transitory computer-readable media storing instructions executable by the one or more processors, wherein the instructions program the one or more processors to perform acts comprising:

determining, from map data about a region, a plurality of road segments;

determining a plurality of road segments, a first road segment of the plurality of road segments including a portion of the region and having at least one first attribute associated with the first road segment;

receiving driving data generated by a vehicle driving in the portion of the region, the driving data including object interactions within an environment of the vehicle;

identifying a second road segment of the plurality of road segments having at least one second attribute corresponding to the at least one first attribute;

determining, based at least in part on the second road segment having the at least one second attribute corresponding to the at least one first attribute of the first road segment, that the object interactions are applicable for testing a vehicle control system in the second road segment;

generating, based at least in part on the second road segment having the at least one second attribute corresponding to the at least one first attribute of the first road segment, a plurality of segment simulation scenarios based at least in part on the object interactions; and validating, based at least in part on the plurality of segment simulation scenarios, a vehicle control system.

34

8. The system of claim 7, wherein the plurality of segment simulation scenarios comprise a plurality of first segment simulation scenarios, the acts, further comprising:

receiving a plurality of functional scenarios with the first road segment, a functional scenario of the plurality of functional scenarios comprising an autonomous vehicle maneuver and at least one of an object or a condition associated with the autonomous vehicle maneuver;

associating a first functional scenario of the plurality of functional scenarios and a second functional scenario of the plurality of functional scenarios with the first road segment;

generating, for the first road segment, first simulation scenarios corresponding to the first functional scenario;

generating, for the first road segment, second simulation scenarios corresponding to the second functional scenario; and generating a plurality of second segment simulation scenarios, wherein the plurality of second segment simulation scenarios comprise the first simulation scenarios and the second simulation scenarios.

9. The system of claim 8, wherein the generating the first simulation scenarios comprises:

determining at least one of a vehicle parameter, an environmental parameter, or an object parameter associated with the first functional scenario;

determining, for the at least one of the vehicle parameter, the environmental parameter, or the object parameter, a set of values;

determining a first of the first simulation scenarios based at least in part on a first value of the set of values; and determining a second of the first simulation scenarios based at least in part on a second value of the set of values.

10. The system of claim 7, wherein the driving data comprises one or more of information about historical object behaviors at the first road segment, sensor data from one or more sensors, or passenger feedback associated with the first road segment.

11. The system of claim 10, wherein the information about historical object behaviors comprises one or more object behavior models associated with the historical object behaviors at the first road segment and wherein the plurality of segment simulation scenarios include information about simulated objects behaving according to the one or more object behavior models.

12. The system of claim 7, the acts further comprising:

determining a first difference between the at least one first attribute and the at least one second attribute;

determining a second difference between the driving data and simulated driving data associated with the plurality of segment simulation scenarios; and determining, based at least in part on one or more of the first difference or the second difference, a limitation for controlling the vehicle in the second road segment.

13. The system of claim 12, wherein determining the plurality of road segments comprises clustering portions of a map based at least in part on one or more attributes.

14. The system of claim 7, wherein the identifying the second road segment comprises determining that the second road segment conforms to a segment stereotype associated with the first road segment, the acts further comprising:

determining a response of the vehicle control system to the plurality of segment simulation scenarios; and based at least in part on an outcome of the response of the vehicle control system to the plurality of segment simulation scenarios, updating the segment stereotype.

15. The system of claim 14, wherein the updating the segment stereotype comprises:
- determining a difference between the at least one first attribute and the at least one second attribute; and
- based at least in part on the difference, modifying a value or range of values associated with the segment stereotype.

16. The system of claim 7, wherein the at least one first attribute comprises at least one of a speed limit for the first road segment, a width of at least a portion of the first road segment, a number of lanes in the first road segment, non-drivable regions in the first road segment, an incline of the first road segment, a curvature, or a permitted type of travel on lanes in the first road segment.

17. A system comprising:
- one or more processors; and
- one or more non-transitory computer-readable media storing instructions executable by the one or more processors, wherein the instructions cause the one or more processors to perform acts comprising:
  - determining first driving data generated by a first vehicle driving in a first region, wherein the first driving data includes data indicative of first object interactions;
  - determining second driving data generated by a second vehicle driving in a second region, wherein the second driving data includes data indicative of second object interactions;
  - determining, based at least in part on map data, a first attribute corresponding to a first roadway of the first driving data;
  - determining, based at least in part on the map data, a second attribute corresponding to a second roadway of the second driving data;
  - determining, based at least in part on the first attribute and the second attribute, a similarity between the first roadway and the second roadway;
  - determining, based at least in part on the similarity between the first roadway and the second roadway, that the first object interactions and the second object interactions are applicable for testing a vehicle control system in a similar roadway to the first roadway or the second roadway; and
  - generating, based at least in part on the similarity between the first roadway and the second roadway, a plurality of simulation scenarios including the similar roadway, wherein the plurality of simulation scenarios include data derived from the first object interactions and the second object interactions.

18. The system of claim 17, wherein the plurality of simulation scenarios are based at least in part on one or more object behavior models associated with historical object behaviors identified in the first object interactions or the second object interactions.

19. The system of claim 17, wherein the plurality of simulation scenarios are a plurality of first simulation scenarios and the instructions cause the one or more processors to perform further acts comprising:
- determining results for a plurality of second simulation scenarios, wherein the plurality of second simulation scenarios include the similar roadway to the first roadway or the second roadway; and
- modifying the results based on the plurality of first simulation scenarios.

20. The system of claim 17, wherein the first attribute and the second attribute correspond to respective configurations of the first roadway and the second roadway.

* * * * *